United States Patent
Yokokawa

(10) Patent No.: US 10,284,398 B2
(45) Date of Patent: May 7, 2019

(54) TRANSMISSION DEVICE, TRANSMISSION METHOD, AND COMMUNICATION SYSTEM

(71) Applicant: Sony Corporation, Tokyo (JP)

(72) Inventor: Takashi Yokokawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 8 days.

(21) Appl. No.: 15/520,692

(22) PCT Filed: Oct. 5, 2015

(86) PCT No.: PCT/JP2015/078170
§ 371 (c)(1),
(2) Date: Apr. 20, 2017

(87) PCT Pub. No.: WO2016/072189
PCT Pub. Date: May 12, 2016

(65) Prior Publication Data
US 2018/0234274 A1    Aug. 16, 2018

(30) Foreign Application Priority Data

Nov. 5, 2014 (JP) .................................. 2014-224924

(51) Int. Cl.
*H04L 25/49* (2006.01)
*H04L 7/02* (2006.01)
(Continued)

(52) U.S. Cl.
CPC .............. *H04L 25/49* (2013.01); *H04L 7/02* (2013.01); *H04L 25/0264* (2013.01);
(Continued)

(58) Field of Classification Search
CPC ..... H04L 25/0272; H04L 7/033; H04L 25/49; H04L 7/02; H04L 25/0264; H04L 25/03; H03K 5/135
See application file for complete search history.

(56) References Cited

U.S. PATENT DOCUMENTS

2013/0223552 A1* 8/2013 Okada ................. H04L 25/4908
375/267
2014/0254732 A1  9/2014 Sengoku et al.
(Continued)

FOREIGN PATENT DOCUMENTS

JP   2001-527239 A   12/2001
JP   2009-182577 A    8/2009
(Continued)

OTHER PUBLICATIONS

Extended European Search Report dated May 29, 2018 for corresponding European Application No. 15856983.0.

*Primary Examiner* — Sung Ahn
(74) *Attorney, Agent, or Firm* — Michael Best & Friedrich LLP

(57) ABSTRACT

A transmission device of the disclosure includes: a transmission symbol generator unit that generates, on the basis of a predetermined number of transition signals each of which indicates a transition in a sequence of transmission symbols, transmission symbol signals that are equal in number to the predetermined number; a serializer unit that serializes the predetermined number of the transmission symbol signals, to generate a serial signal; and a driver unit that operates on the basis of the serial signal.

20 Claims, 15 Drawing Sheets

(51) Int. Cl.
*H04L 25/493* (2006.01)
*H04L 25/02* (2006.01)
*H04L 25/03* (2006.01)
*H03K 5/135* (2006.01)

(52) U.S. Cl.
CPC ............ *H04L 25/03* (2013.01); *H04L 25/493* (2013.01); *H04L 25/4917* (2013.01); *H03K 5/135* (2013.01)

(56) References Cited

U.S. PATENT DOCUMENTS

| | | | |
|---|---|---|---|
| 2014/0270026 A1 | 9/2014 | Sengoku et al. | |
| 2015/0263823 A1* | 9/2015 | Sengoku | H04L 1/0041 714/776 |
| 2015/0295701 A1* | 10/2015 | Sengoku | H04L 7/0008 375/355 |

FOREIGN PATENT DOCUMENTS

| | | |
|---|---|---|
| JP | 2010-520715 A | 8/2010 |
| JP | 2011-517159 A | 5/2011 |

* cited by examiner

[ FIG. 1 ]
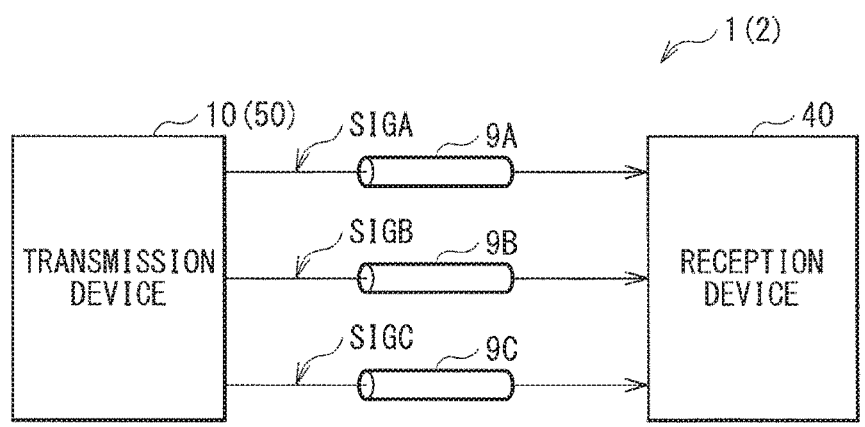
[ FIG. 2 ]
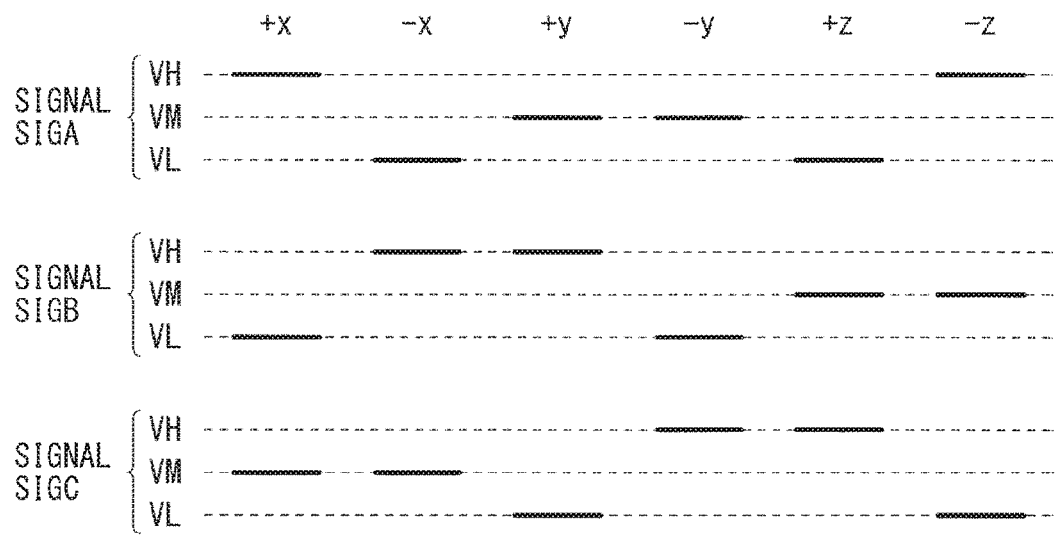

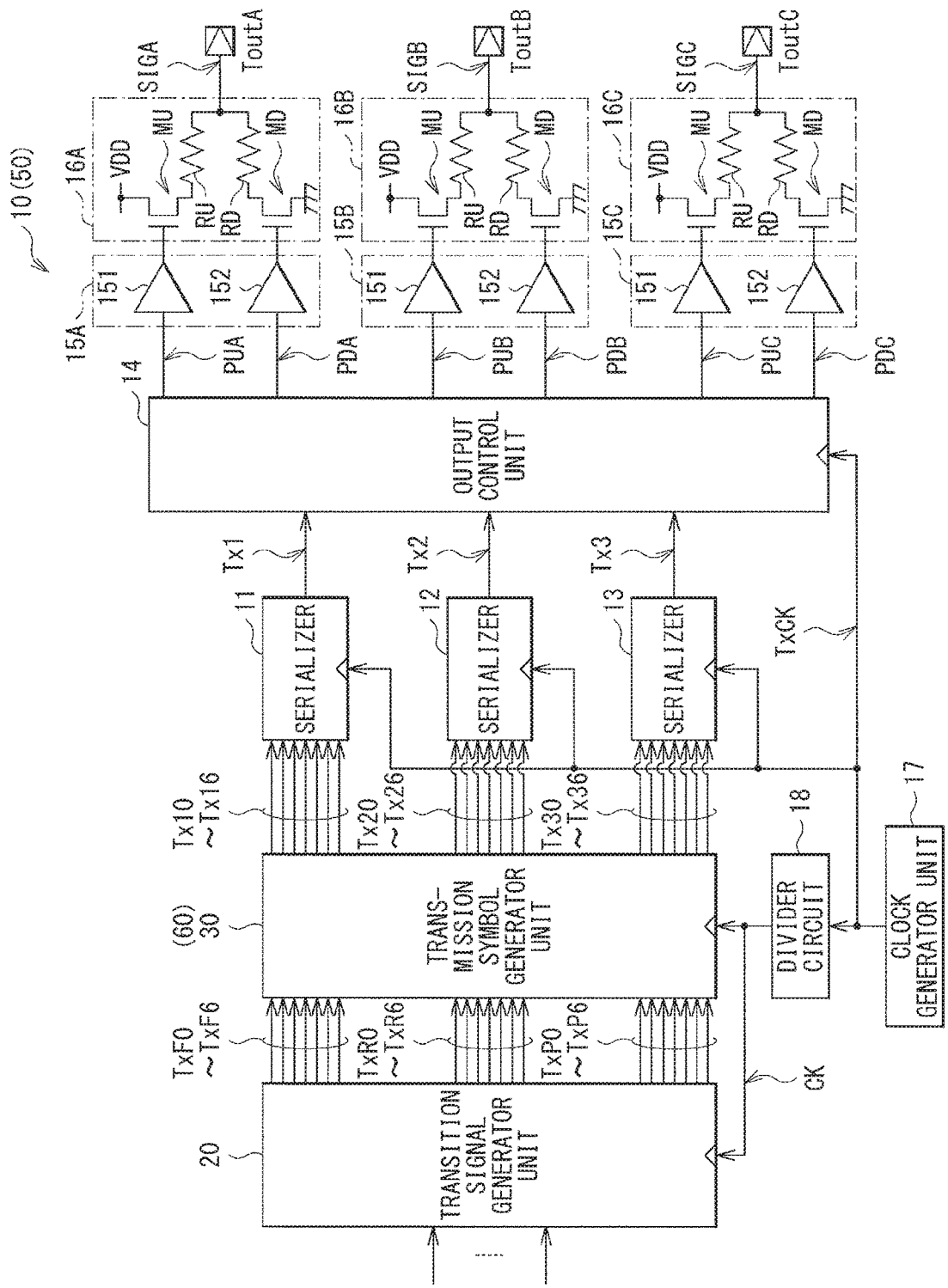
[FIG.3]

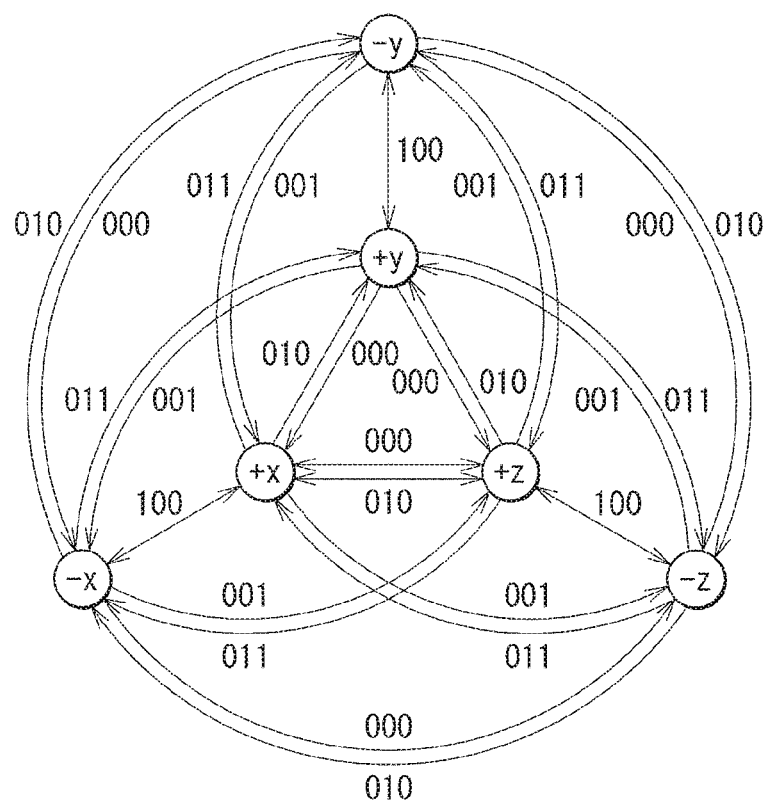
[ FIG. 4 ]

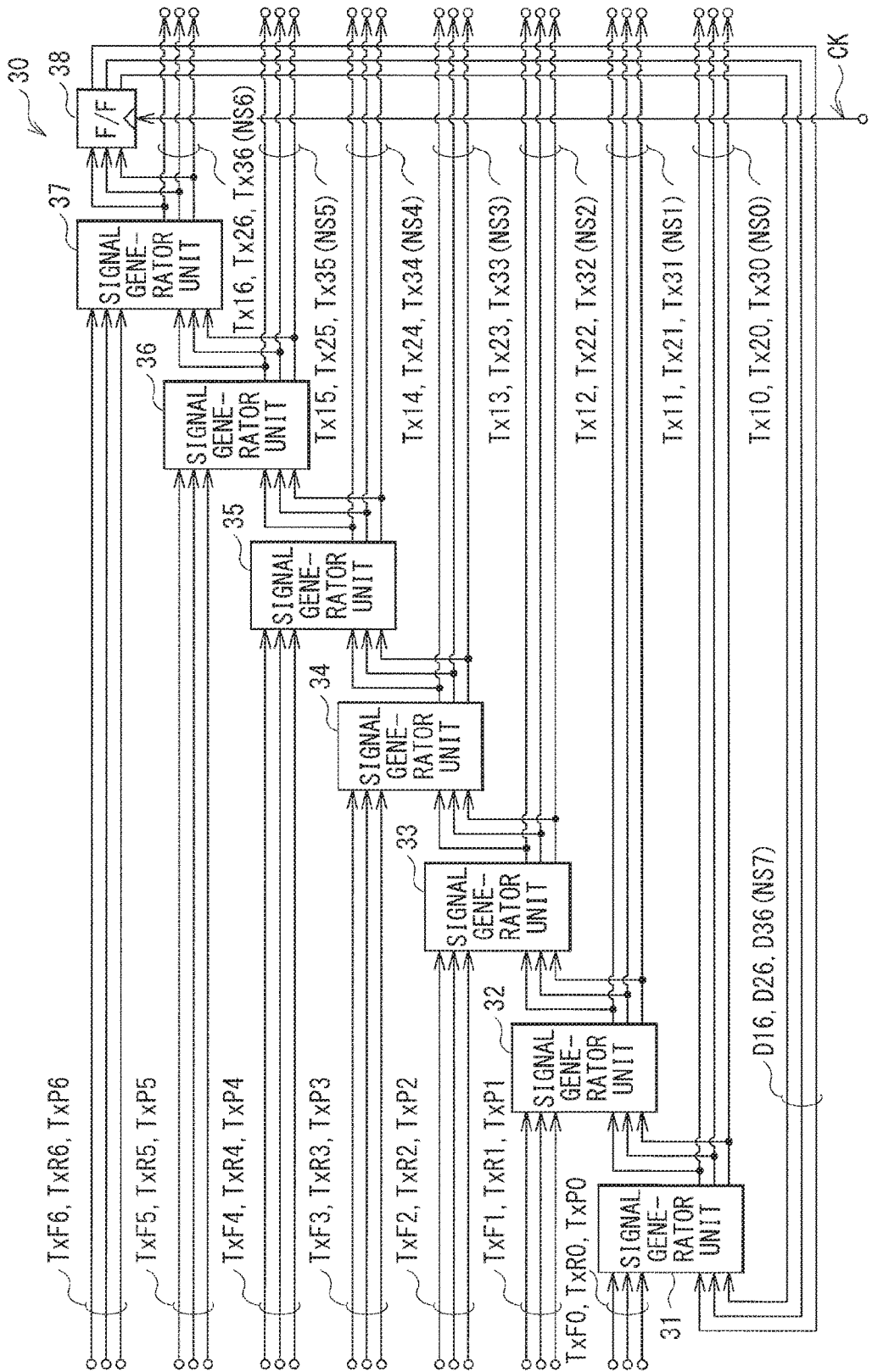
[FIG.5]

[ FIG. 6 ]

| SYMBOL | SYMBOL SIGNAL Tx10 | SYMBOL SIGNAL Tx20 | SYMBOL SIGNAL Tx30 |
|---|---|---|---|
| +x | 1 | 0 | 0 |
| -x | 0 | 1 | 1 |
| +y | 0 | 1 | 0 |
| -y | 1 | 0 | 1 |
| +z | 0 | 0 | 1 |
| -z | 1 | 1 | 0 |

[ FIG. 7 ]

(A) SYMBOL SIGNAL Tx1: Tx15, Tx16, Tx10, Tx11, Tx12, Tx13, Tx14, Tx15, Tx16, Tx10, Tx11

(B) SYMBOL SIGNAL Tx2: Tx25, Tx26, Tx20, Tx21, Tx22, Tx23, Tx24, Tx25, Tx26, Tx20, Tx21

(C) SYMBOL SIGNAL Tx3: Tx35, Tx36, Tx30, Tx31, Tx32, Tx33, Tx34, Tx35, Tx36, Tx30, Tx31

Columns: NS0, NS1, NS2, NS3, NS4, NS5, NS6

[ FIG. 8 ]

| SYMBOL | SYMBOL SIGNAL Tx1 | SYMBOL SIGNAL Tx2 | SYMBOL SIGNAL Tx3 | SIGNAL PUA | SIGNAL PDA | SIGNAL PUB | SIGNAL PDB | SIGNAL PUC | SIGNAL PDC | SIGNAL SIGA | SIGNAL SIGB | SIGNAL SIGC |
|---|---|---|---|---|---|---|---|---|---|---|---|---|
| +x | 1 | 0 | 0 | 1 | 0 | 0 | 1 | 0 | 0 | VH | VL | VM |
| −x | 0 | 1 | 1 | 0 | 1 | 1 | 0 | 0 | 0 | VL | VH | VM |
| +y | 0 | 1 | 0 | 0 | 0 | 1 | 0 | 0 | 1 | VM | VH | VL |
| −y | 1 | 0 | 1 | 0 | 0 | 0 | 1 | 1 | 0 | VM | VL | VH |
| +z | 0 | 0 | 1 | 0 | 1 | 0 | 0 | 1 | 0 | VL | VM | VH |
| −z | 1 | 1 | 0 | 1 | 0 | 0 | 0 | 0 | 1 | VH | VM | VL |

[FIG. 9]
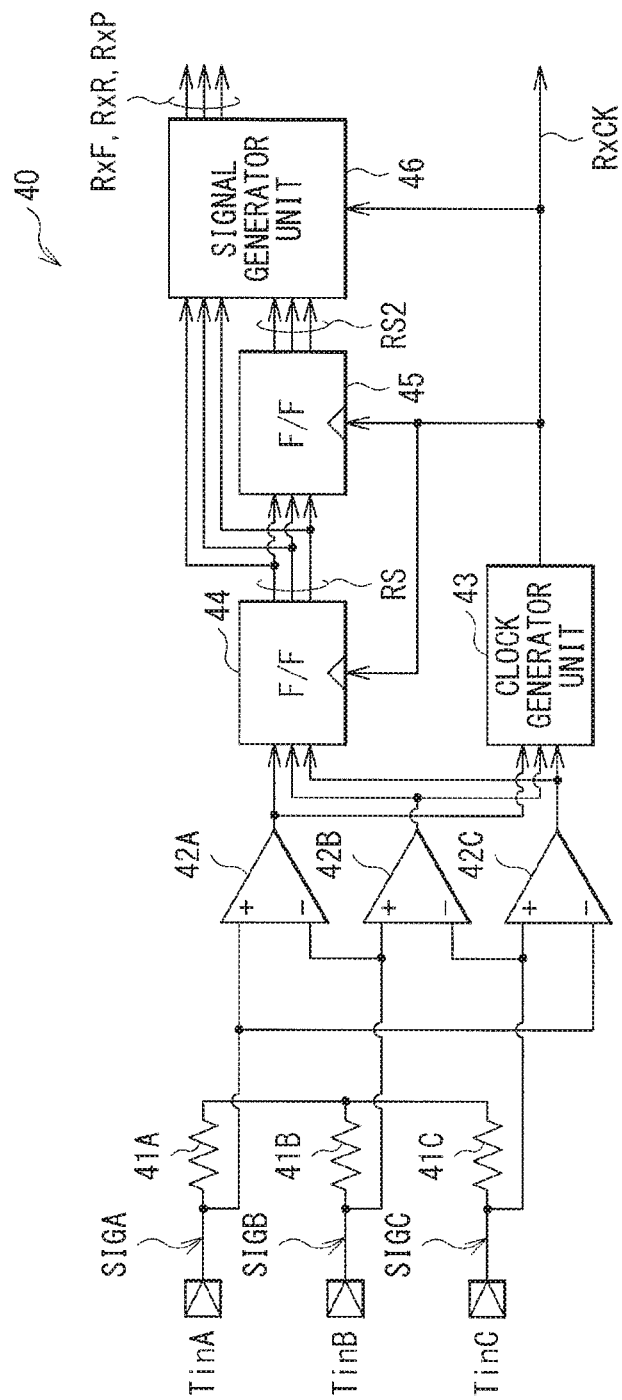

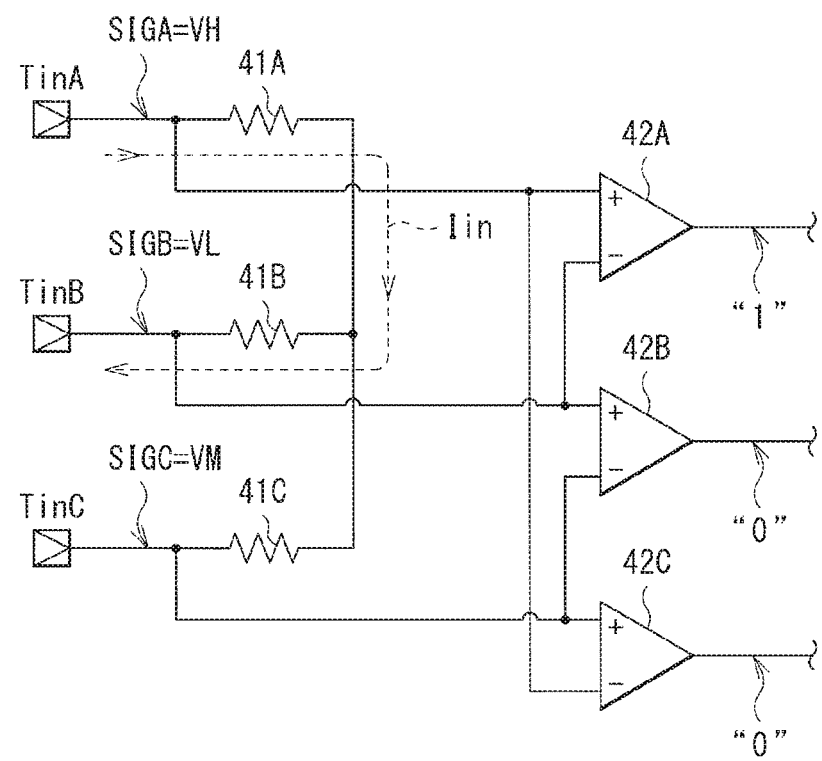
[ FIG. 10 ]

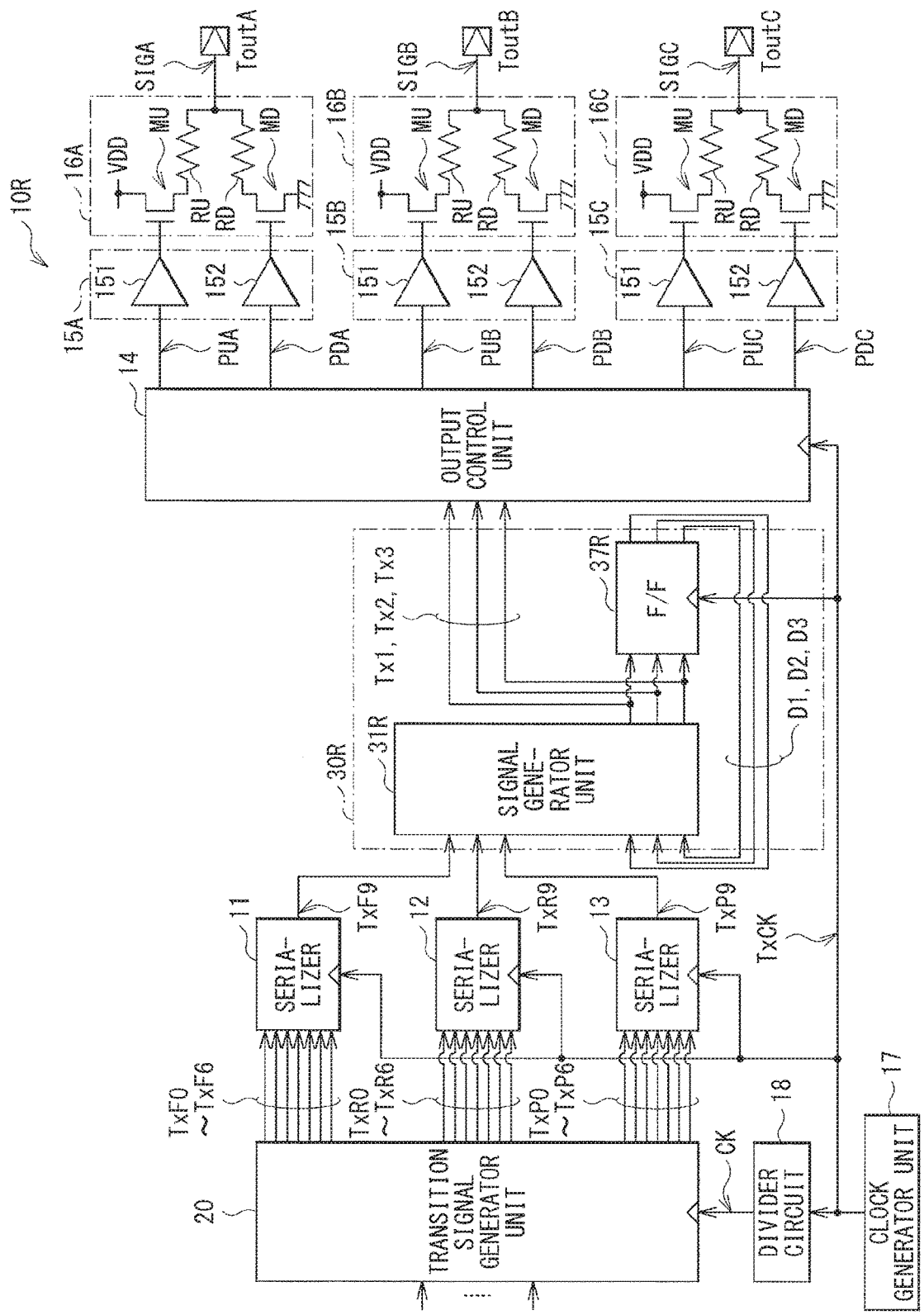
[FIG. 11]

[ FIG. 12 ]
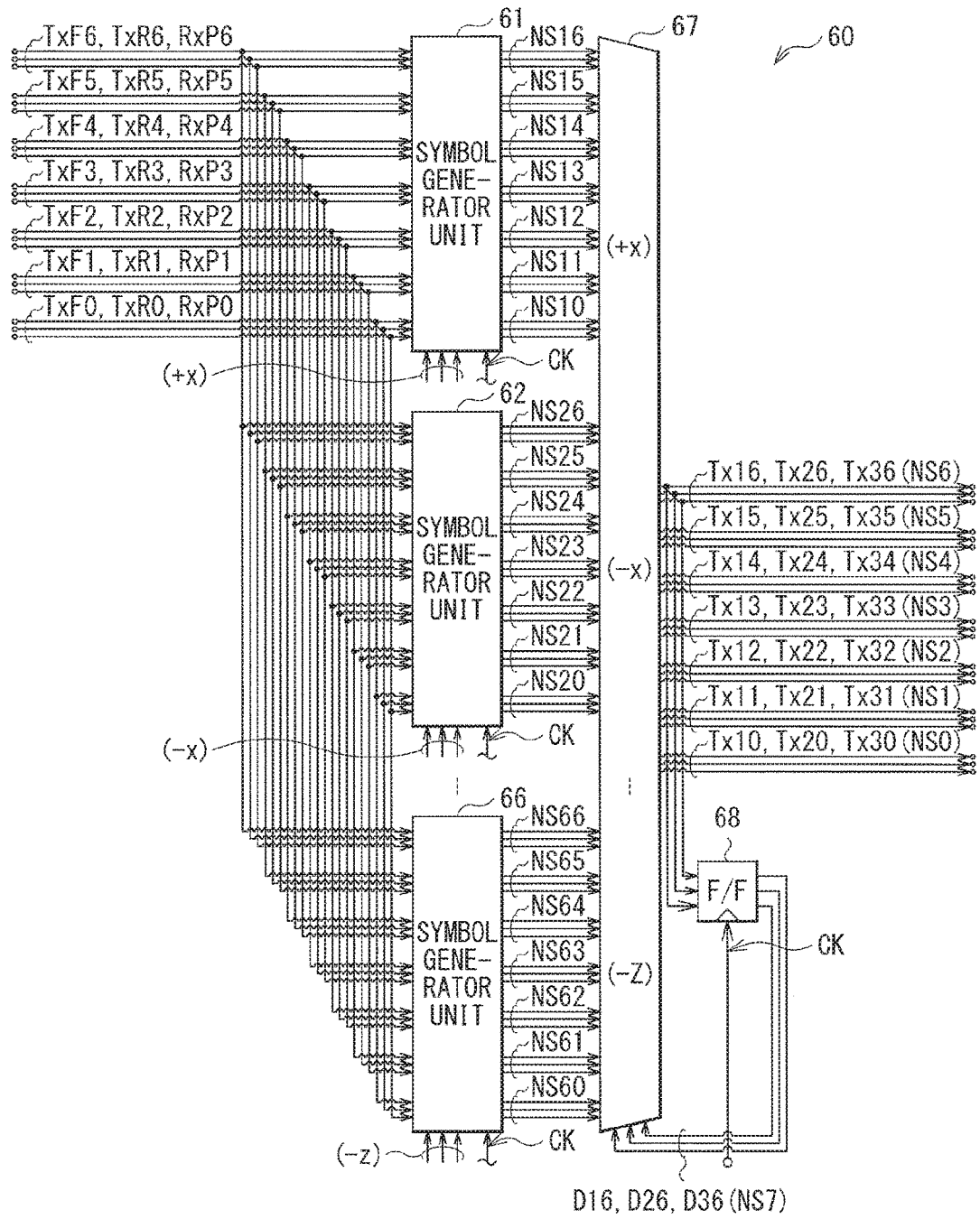

[ FIG. 13 ]
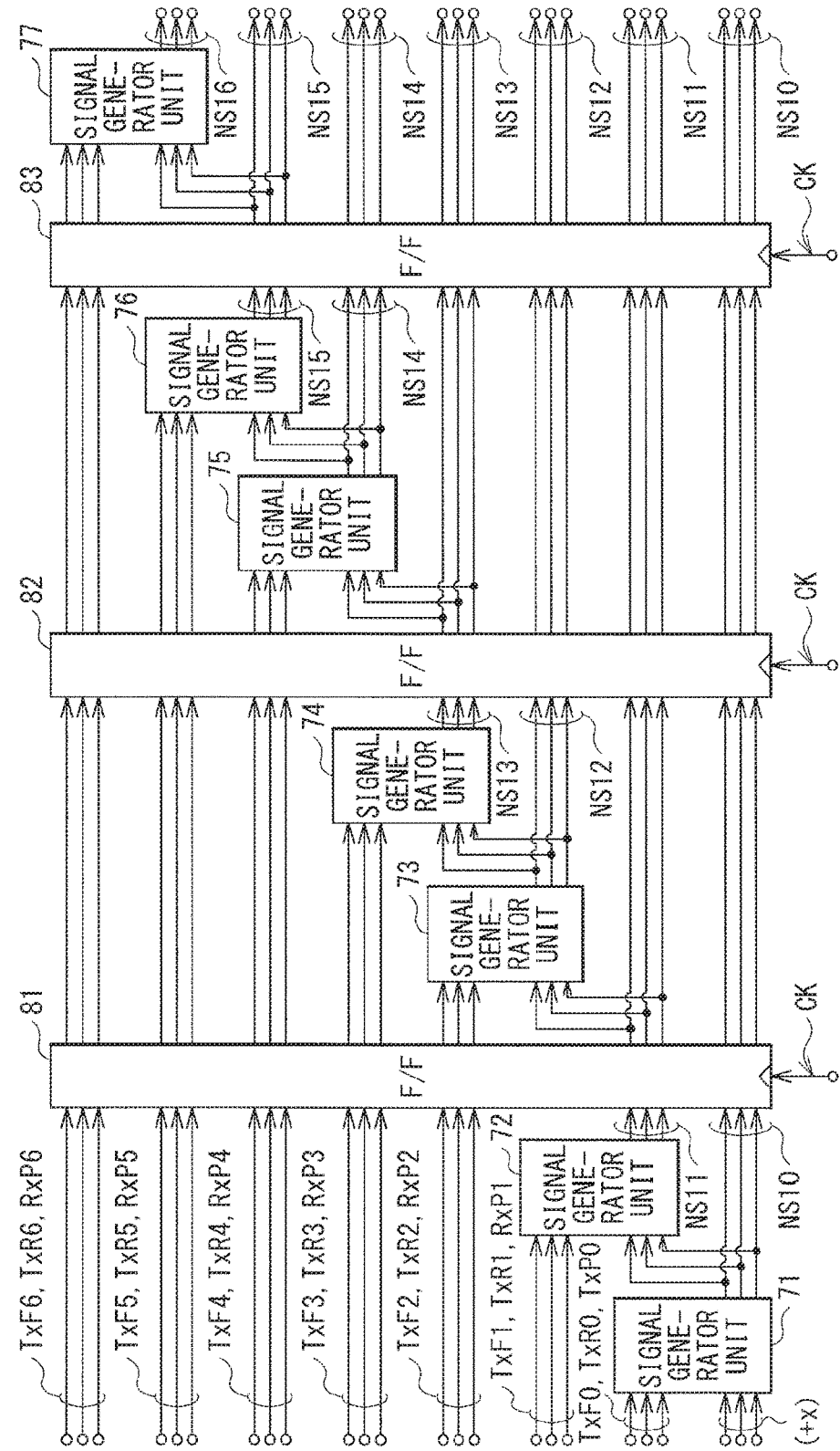

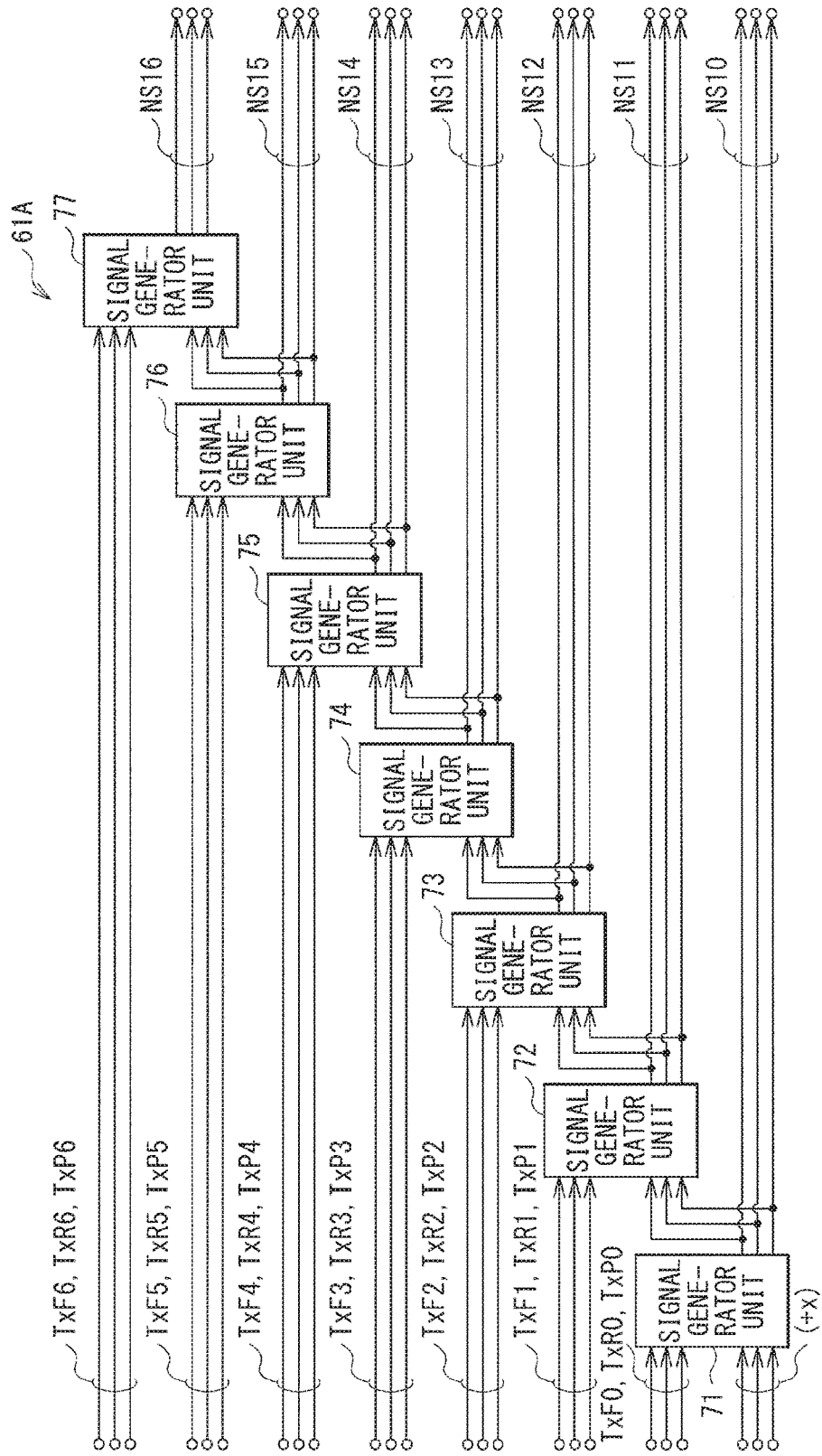
[FIG. 14]

[ FIG. 15 ]
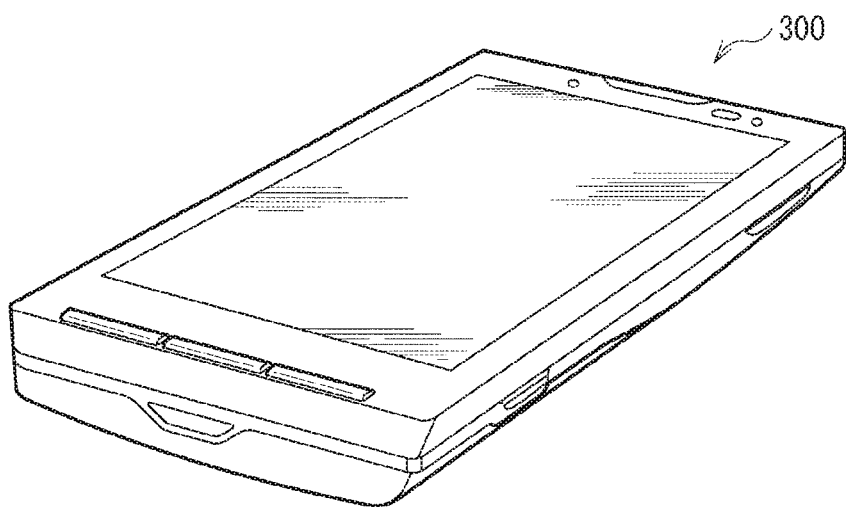

[ FIG. 16 ]
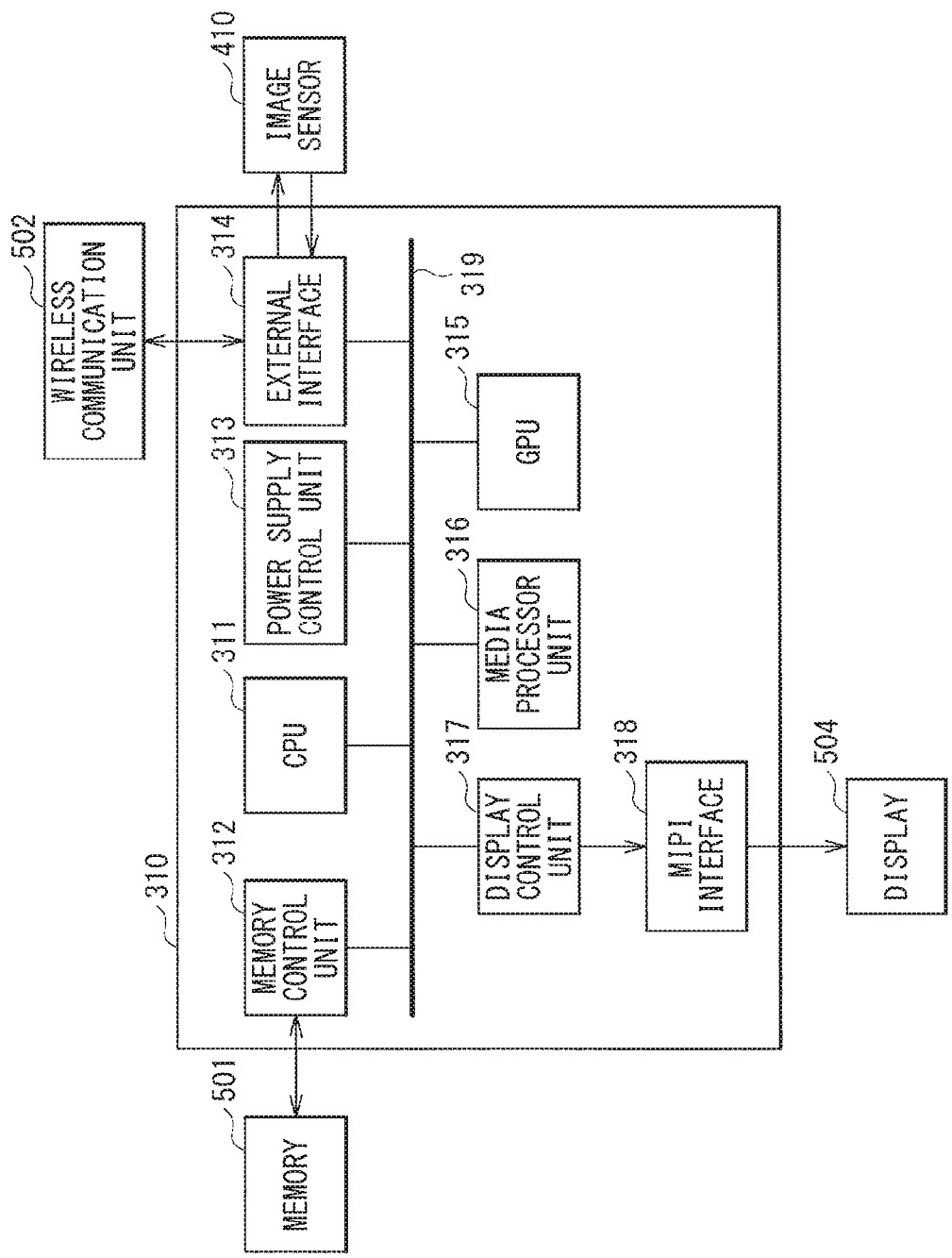

[ FIG. 17 ]
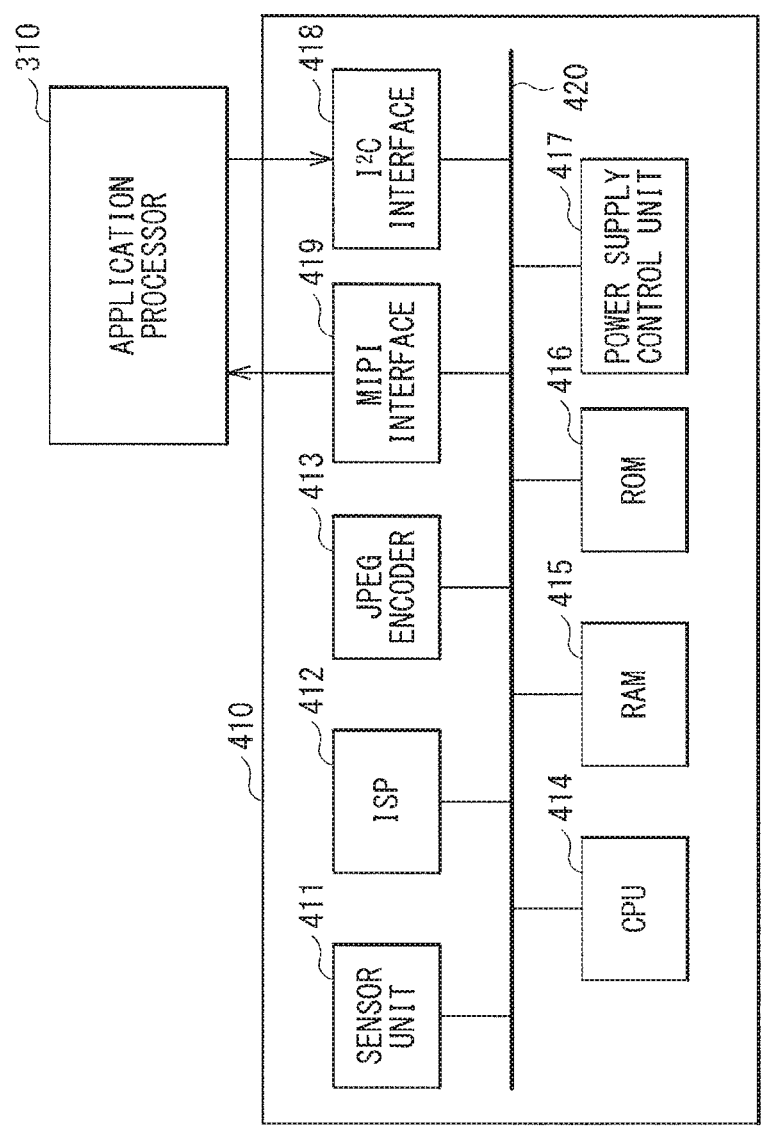

TRANSMISSION DEVICE, TRANSMISSION METHOD, AND COMMUNICATION SYSTEM

TECHNICAL FIELD

The disclosure relates to a transmission device and a transmission method that perform signal transmission, and a communication system including the transmission device.

BACKGROUND

With higher functionalization and multifunctionalization of electronic apparatuses in recent years, the electronic apparatuses are equipped with various devices such as semiconductor chips, sensors, and display devices. Among these devices, data exchange is performed in a large amount. The amount of data has been increasing in accordance with the higher functionalization and the multifunctionalization of the electronic apparatuses. Accordingly, the data exchange is often carried out with utilization of a high-speed interface that is able to transmit and receive data at a speed of, for example, several Gbps.

Regarding methods of increasing transmission capacity even more, various techniques have been disclosed. For example, PTLs 1 and 2 disclose communication systems in which data exchange is carried out with utilization of three voltage levels.

CITATION LIST

Patent Literature

PTL 1: Japanese Unexamined Patent Application Publication (Translation of PCT Application) No. 2011-517159
PTL 2: Japanese Unexamined Patent Application Publication (Translation of PCT Application) No. 2010-520715

SUMMARY OF THE INVENTION

As described, in the communication system, larger transmission capacity is desired, expectation of a further increase in the transmission capacity.

It is therefore desirable to provide a transmission device, a transmission method, and a communication system that make it possible to increase transmission capacity.

A transmission device according to an embodiment of the disclosure includes a transmission symbol generator unit, a serializer unit, and a driver unit. The transmission symbol generator unit generates, on the basis of a predetermined number of transition signals each of which indicates a transition in a sequence of transmission symbols, transmission symbol signals that are equal in number to the predetermined number. The serializer unit serializes the predetermined number of the transmission symbol signals, to generate a serial signal. The driver unit operates on the basis of the serial signal.

A transmission method according to an embodiment of the disclosure includes: generating, on the basis of a predetermined number of transition signals each of which indicates a transition in a sequence of transmission symbols, transmission symbol signals that are equal in number to the predetermined number; serializing the predetermined number of the transmission symbol signals, to generate a serial signal; and controlling operation of a driver unit, in accordance with the transmission symbols indicated by the serial signal.

A communication system according to an embodiment of the disclosure includes a transmission device and a reception device. The transmission device includes a transmission symbol generator unit, a serializer unit, and a driver unit. The transmission symbol generator unit generates, on the basis of a predetermined number of transition signals each of which indicates a transition in a sequence of transmission symbols, transmission symbol signals that are equal in number to the predetermined number. The serializer unit serializes the predetermined number of the transmission symbol signals, to generate a serial signal. The driver unit operates on the basis of the serial signal.

In the transmission device, the transmission method, and the communication system according to the embodiments of the disclosure, the predetermined number of the transmission symbol signals are serialized to generate the serial signal. The driver unit operates on the basis of the serial signal. The predetermined number of the transmission symbol signals are generated on the basis of the predetermined number of the transition signals.

According to the transmission device, the transmission method, and the communication system of the embodiments of the disclosure, the predetermined number of the transmission symbol signals are generated on the basis of the predetermined number of the transition signals. The predetermined number of the transmission symbol signals are serialized to generate the symbol signal. Hence, it is possible to increase transmission capacity. It is to be noted that effects of the disclosure are not necessarily limited to the effects described above, and may include any of effects that are described herein.

BRIEF DESCRIPTION OF DRAWING

FIG. 1 is a block diagram that illustrates one configuration example of a communication system according to one example embodiment of the disclosure.

FIG. 2 is a descriptive diagram that illustrates voltage states of signals transmitted and received by the communication system illustrated in FIG. 1.

FIG. 3 is a block diagram that illustrates one configuration example of a transmission device illustrated in FIG. 1.

FIG. 4 is a descriptive diagram that illustrates transitions of symbols transmitted and received by the communication system illustrated in FIG. 1.

FIG. 5 is a block diagram that illustrates one configuration example of a transmission symbol generator unit according to a first embodiment.

FIG. 6 is a table that summarizes one operation example of the transmission symbol generator unit illustrated in FIG. 5.

FIG. 7 is a timing waveform chart that illustrates one operation example of serializers illustrated in FIG. 3.

FIG. 8 is a table that summarizes one operation example of the transmission device illustrated in FIG. 3.

FIG. 9 is a block diagram that illustrates one configuration example of a reception device illustrated in FIG. 1.

FIG. 10 is a descriptive diagram that illustrates one example of reception operation of the reception device illustrated in FIG. 9.

FIG. 11 is a block diagram that illustrates one configuration example of a transmission device according to a comparative example.

FIG. 12 is a block diagram that illustrates one configuration example of a transmission symbol generator unit according to a second embodiment.

FIG. 13 is a block diagram that illustrates one configuration example of a symbol generator unit illustrated in FIG. 12.

FIG. 14 is a block diagram that illustrates one configuration example of a symbol generator unit according to a modification example.

FIG. 15 is a perspective view of an external appearance and a configuration of a smartphone to which the communication system according to the example embodiment is applied.

FIG. 16 is a block diagram that illustrates one configuration example of an application processor to which the communication system according to the example embodiment is applied.

FIG. 17 is a block diagram that illustrates one configuration example of an image sensor to which the communication system according to the example embodiment is applied.

MODES FOR CARRYING OUT THE INVENTION

In the following, some embodiments of the disclosure are described in detail with reference to the drawings. It is to be noted that description is made in the following order.
1. First Embodiment
2. Second Embodiment
3. Application Example 1. First Embodiment Configuration Example FIG. 1 illustrates one configuration example of a communication system (a communication system 1) to which a transmission device according to a first embodiment is applied. It is to be noted that since a transmission method according to an embodiment of the disclosure is embodied by this embodiment, description thereof is made together. The communication system 1 may perform communication with utilization of a signal having three voltage levels.

The communication system 1 includes a transmission device 10 and a reception device 40. In the communication system 1, the transmission device 10 may transmit, to the reception device 40, signals SIGA, SIGB, and SIGC through transmission paths 9A, 9B, and 9C, respectively. Characteristic impedance of the transmission paths 9A to 9C that transmit the signals may be 50 [Ω] in this example. The signals SIGA, SIGB, and SIGC may each make transitions among the three voltage levels (a high level voltage VH, a medium level voltage VM, and a low level voltage VL).

FIG. 2 illustrates voltage states of the signals SIGA, SIGB, and SIGC. The transmission device 10 may transmit six symbols "+x", "−x", "+y", "−x", "+z", and "−z" with utilization of the three signals SIGA, SIGB, and SIGC. For example, in a case of the transmission of the symbol "+x", the transmission device 10 may allow the signal SIGA to be the high level voltage VH, allow the signal SIGB to be the low level voltage VL, and allow the signal SIGC to be the medium level voltage VM. In a case of the transmission of the symbol "−x", the transmission device 10 may allow the signal SIGA to be the low level voltage VL, allow the signal SIGB to be the high level voltage VH, and allow the signal SIGC to be the medium level voltage VM. In a case of the transmission of the symbol "+y", the transmission device 10 may allow the signal SIGA to be the medium level voltage VM, allow the signal SIGB to be the high level voltage VH, and allow the signal SIGC to be the low level voltage VL. In a case of the transmission of the symbol "−y", the transmission device 10 may allow the signal SIGA to be the medium level voltage VM, allow the signal SIGB to be the low level voltage VL, and allow the signal SIGC to be the high level voltage VH. In a case of the transmission of the symbol "+z", the transmission device 10 may allow the signal SIGA to be the low level voltage VL, allow the signal SIGB to be the medium level voltage VM, and allow the signal SIGC to be the high level voltage VH. In a case of the transmission of the symbol "−z", the transmission device 10 may allow the signal SIGA to be the high level voltage VH, allow the signal SIGB to be the medium level voltage VM, and allow the signal SIGC to be the low level voltage VL.

FIG. 3 illustrates one configuration example of the transmission device 10. The transmission device 10 may include a clock generator unit 17, a divider circuit 18, a transition signal generator unit 20, a transmission symbol generator unit 30, serializers 11 to 13, an output control unit 14, pre-driver units 15A to 15C, and driver units 16A to 16C.

The clock generator unit 17 may generate a clock TxCK. A frequency of the clock TxCK may be, for example, 2 [GHz]. The clock generator unit 17 may be constituted by, for example, a PLL (Phase Locked Loop), and generate the clock TxCK on the basis of a reference clock (not illustrated) supplied from, for example, outside of the transmission device 10. Moreover, the clock generator unit 17 may supply the clock TxCK to the divider circuit 18, the serializers 11 to 13, and the output control unit 14.

The divider circuit 18 may perform division operation on the basis of the clock TxCK, to generate a clock CK. The divider circuit 18 may perform, in this example, the division operation by seven. In other words, a frequency of the clock CK may be, in this example, 285 [MHz] (=2 [GHz]/7). Moreover, the divider circuit 18 may supply the clock CK to the transition signal generator unit 20 and the transmission symbol generator unit 30.

The transition signal generator unit 20 may generate transition signals TxF0 to TxF6, TxR0 to TxR6, and TxP0 to TxP6, on the basis of an inputted signal and the clock CK. Here, a single set of the transition signals TxF0, TxR0, and TxP0 may indicate a transition of a symbol in a sequence of symbols to be transmitted by the transmission device 10. Similarly, a single set of the transition signals TxF1, TxR1, and TxP1 may indicate the transition of the symbol. A single set of the transition signals TxF2, TxR2, and TxP2 may indicate the transition of the symbol. A single set of the transition signals TxF3, TxR3, and TxP3 may indicate the transition of the symbol. A single set of the transition signals TxF4, TxR4, and TxP4 may indicate the transition of the symbol. A single set of the transition signals TxF5, TxR5, and TxP5 may indicate the transition of the symbol. A single set of the transition signals TxF6, TxR6, and TxP6 may indicate the transition of the symbol. In other words, the transition signal generator unit 20 may generate seven sets of the transition signals. In the following, the term "transition signal TxF" is utilized, as appropriate, to denote any one of the transition signals TxF0 to TxF6. The term "transition signal TxR" is utilized, as appropriate, to denote any one of the transition signals TxR0 to TxR6. The term "transition signal TxP" is utilized, as appropriate, to denote any one of the transition signals TxP1 to TxP6.

FIG. 4 illustrates relation between the transition signals TxF, TxR, and TxP, and the transitions of the symbol. A three-digit numerical value assigned to each of the transitions indicates values of the transition signals TxF, TxR, and TxP in the order named.

The transition signal TxF (Flip) may allow the symbol to make the transition between "+x" and "−x", allow the symbol to make the transition between "+y" and "−y", and allow the symbol to make the transition between "+z" and "−z". In one specific example, in a case in which the transition signal TxF is "1", the transition may be made so as to change polarity of the symbol (e.g., from "+x" to "−x"). In a case in which the transition signal TxF is "0", no such transition may be made.

The transition signals TxR (Rotation) and TxP (Polarity) may allow the symbol to make the transition between "+x" and other than "−x", between "+y" and other than "−y", or "+z" and other than "−z", in a case in which the transition signal TxF is "0". In one specific example, in a case in which the transition signals TxR and TxP are respectively "1" and "0", the transition may be made in a clockwise direction (e.g., from "+x" to "+y") in FIG. 4, with the polarity of the symbol being maintained. In a case in which the transition signals TxR and TxP are respectively "1" and "1", the transition may be made in the clockwise direction (e.g., from "+x" to "−y") in FIG. 4, with the polarity of the symbol being changed. Moreover, in a case in which the transition signals TxR and TxP are respectively "0" and "0", the transition may be made in a counterclockwise direction (e.g., from "+x" to "+z") in FIG. 4, with the polarity of the symbol being maintained. In a case in which the transition signals TxR and TxP are respectively "0" and "1", the transition may be made in the counterclockwise direction (e.g., from "+x," to "−z") in FIG. 4, with the polarity of the symbol being changed.

The transition signal generator unit 20 may generate the seven sets of the transition signals TxF, TxR, and TxP as described. Moreover, the transition signal generator unit 20 may supply the seven sets of the transition signals TxF, TxR, and TxP (the transition signals TxF0 to TxF6, TxR0 to TxR6, and TxP0 to TxP6) to the transmission symbol generator unit 30.

The transmission symbol generator unit 30 may generate symbol signals Tx10 to Tx16, Tx20 to Tx26, and Tx30 to Tx36, on the basis of the transition signals TxF0 to TxF6, TxR0 to TxR6, and TxP0 to TxP6 and on the basis of the clock CK. Here, a single set of the symbol signals Tx10, Tx20, and Tx30 may indicate any one of the six symbols "+x", "−x", "+y", "−y", "+z", and "−z". Similarly, a single set of the symbol signals Tx11, Tx21, Tx31 may indicate any one of the six symbols. A single set of the symbol signals Tx12, Tx22, and Tx32 may indicate any one of the six symbols. A single set of the symbol signals Tx13, Tx23, and Tx33 may indicate any one of the six symbols. A single set of the symbol signals Tx14, Tx24, and Tx34 may indicate any one of the six symbols. A single set of the symbol signals Tx15, Tx25, and Tx35 may indicate any one of the six symbols. A single set of the symbol signals Tx16, Tx26, and Tx36 may indicate any one of the six symbols. In other words, the transmission symbol generator unit 30 may generate seven sets of the symbol signals, on the basis of the seven sets of the transition signals.

FIG. 5 illustrates one configuration example of the transmission symbol generator unit 30. The transmission symbol generator unit 30 may include seven signal generator units 31 to 37, and a flip flop (F/F) 38.

The signal generator unit 31 may generate the single set of the symbol signals Tx10, Tx20, and Tx30, on the basis of the single set of the transition signals TxF0, TxR0, and TxP0 and on the basis of a single set of symbol signals D16, D26, and D36. In one specific example, the signal generator unit 31 may obtain a symbol NS0 after the transition, as illustrated in FIG. 4, on the basis of a symbol NS7 indicated by the single set of the symbol signals D16, D26, and D36 and on the basis of the single set of the transition signals TxF0, TxR0, and TxP0. In other words, the single set of the transition signals TxF0, TxR0, and TxP0 may indicate the transition from the symbol NS7 to the symbol NS0. Moreover, the signal generator unit 31 may output the symbol NS0 generated, as the single set of the symbol signals Tx10, Tx20, and Tx30. In this example, the six symbols "+x", "−x", "+y", "−y", "+z", and "−z" may be associated, as summarized in FIG. 6, with the three-bit symbol signals Tx10, T20, and Tx30.

Similarly, the signal generator unit 32 may generate the single set of the symbol signals Tx11, Tx21, and Tx31 (a symbol NS1), on the basis of the single set of the transition signals TxF1, TxR1, and TxP1 and on the basis of the single set of the symbol signals Tx10, Tx20, and Tx30 (the symbol NS0). The signal generator unit 33 may generate the single set of the symbol signals Tx12, Tx22, and Tx32 (a symbol NS2), on the basis of the single set of the transition signals TxF2, TxR2, and TxP2 and on the basis of the single set of the symbol signals Tx11, Tx21, and Tx31 (the symbol NS1). The symbol generator unit 34 may generate the single set of the symbol signals Tx13, Tx23, and Tx33 (a symbol NS3), on the basis of the single set of the transition signals TxF3, TxR3, and TxP3 and on the basis of the single set of the symbol signals Tx12, Tx22, and Tx32 (the symbol NS2). The signal generator unit 35 may generate the single set of the symbol signals Tx14, Tx24, and Tx34 (a symbol NS4), on the basis of the single set of the transition signals TxF4, TxR4, and TxP4 and on the basis of the single set of the symbol signals Tx13, Tx23, and Tx33 (the symbol NS3). The signal generator unit 36 may generate the single set of the symbol signals Tx15, Tx25, and Tx35 (a symbol NS5), on the basis of the single set of the transition signals Tx5, TxR5, and TxP5 and on the basis of the single set of the symbol signals Tx14, Tx24, and Tx34 (the symbol NS4). The signal generator unit 37 may generate the single set of the symbol signals Tx16, Tx26, and Tx36 (a symbol NS6), on the basis of the single set of the transition signals TxF6, TxR6, and TxP6 and on the basis of the single set of the symbol signals Tx15, Tx25, and Tx35 (the symbol NS5). Thus, the signal generator units 31 to 36 may be sequentially coupled to one another.

The flip flop 38 may perform, on the basis of the clock CK, samplings of the single set of the symbol signals Tx16, Tx26, and Tx36, and output results of the samplings as the single set of the symbol signals D16, D26, and D36, respectively. In other words, the flip flop 38 may allow the symbol NS6 indicated by the single set of the symbol signals Tx16, Tx26, and Tx36 to be delayed by a term of one clock of the clock CK, to output the resultant symbol as the single set of the symbol signals D16, D26, and D36 (a symbol NS7).

With this configuration, in the transmission symbol generator unit 30, in a certain term of cycles of the clock CK, the signal generator units 31 to 37 may sequentially generate the symbols NS0 to NS6. Moreover, the flip flop 38 may supply the symbol NS6 generated by the signal generator unit 37, in a next term of the cycles, as the symbol NS7, to the signal generator unit 31.

The serializer 11 may serialize the symbol signals Tx10 to Tx16 in the order named, on the basis of the symbol signals Tx10 to Tx16 and on the basis of the clock TxCK, to generate a symbol signal Tx1. The serializer 12 may serialize the symbol signals Tx20 to Tx26 in the order named, on the basis of the symbol signals Tx20 to Tx26 and on the basis of the clock TxCK, to generate a symbol signal Tx2. The serializer 13 may serialize the symbol signals Tx30 to Tx36 in the order named, on the basis of the symbol signals Tx30 to Tx36 and on the basis of the clock TxCK, to generate a symbol signal Tx3.

FIG. 7 illustrates operation of the serializers 11 to 13, with (A) indicating a waveform of the symbol signal Tx1, with (B) indicating a waveform of the symbol signal Tx2, and with (C) indicating a waveform of the symbol signal Tx3. The serializer 11 may repeatedly output the symbol signals Tx10 to Tx16 in this order. The serializer 12 may repeatedly output the symbol signals Tx20 to Tx26 in this order. The serializer 13 may repeatedly output the symbol signals Tx30 to Tx36 in this order. Thus, the serializers 11 to 13 may repeatedly output the symbols NS0 to NS6 in this order.

The output control unit 14 may generate six signals PUA, PDA, PUB, PDB, PUC, and PDC, on the basis of the symbol signals Tx1, Tx2, and Tx3 and on the basis of the clock TxCK. Moreover, the output control unit 14 may supply the signals PUA and PDA to the pre-driver unit 15A, supply the signals PUB and PDB to the pre-driver unit 15B, and supply the signals PUC and PDC to the pre-driver unit 15C.

The pre-driver unit 15A may drive the driver unit 16A on the basis of the signals PUA and PDA. The pre-driver unit 15B may drive the driver unit 16B on the basis of the signals PUB and PDB. The pre-driver unit 15C may drive the driver 16C on the basis of the signals PUC and PDC.

The pre-driver unit 15A may include pre-drivers 151 and 152. The pre-driver 151 may drive a transistor MU (described later) of the driver unit 16A on the basis of the signal PUA. The pre-driver 152 may drive a transistor MD (described later) of the driver unit 16A on the basis of the signal PDA. The same may apply to the pre-driver units 15B and 15C.

The driver unit 16A may generate the signal SIGA. The driver unit 16B may generate the signal SIGB. The driver unit 16C may generate the signal SIGC.

The driver unit 16A may include the transistors MU and MD, and resistors RU and RD. The transistors MU and MD may be N-channel MOS (Metal Oxide Semiconductor) FETs (Field Effect Transistors). The transistor MU mays include a drain supplied with a power supply voltage VDD, a gate supplied with an output signal of the pre-driver 151 of the pre-driver unit 15A, and a source coupled to one end of the resistor RU. The transistor MD may include a drain coupled to one end of the resistor RD a gate supplied with an output signal of the pre-driver 152 of the pre-driver unit 15A, and a source that is grounded. The resistors RU and RD may function as terminators, and be 50 [Ω] each in this example. The resistor RU may have the one end coupled to the source of the transistor MU, and another end coupled to another end of the resistor RD and coupled to an output terminal ToutA. The resistor RD may have the one end coupled to the drain of the transistor MD, and the other end coupled to the other end of the resistor RU and coupled to the output terminal ToutA. The same may apply to the driver units 16B and 16C.

With this configuration, the output control unit 14, the pre-driver units 15A to 15C, and the driver units 16A to 16C may set, on the basis of the symbol signals Tx1 to Tx3, voltages of the output terminals ToutA to ToutC, as illustrated in FIG. 2, as the respectively different three voltages (the high level voltage VH, the medium level voltage VM, and the low level voltage VL).

FIG. 8 illustrates one operation example of the transmission device 10. For example, in a case in which the transmission device 10 transmits the symbol "+x", the symbol signals Tx1, Tx2, and Tx3 may become "100", as with the symbol signals Tx10, Tx20, and Tx30 illustrated in FIG. 6. The output control unit 14 may allow the signals PUA, PDA, PUB, PDB, PUC, and PDC to be "100100", on the basis of the symbol signals Tx1, Tx2, and Tx3. Accordingly, in the driver unit 16A, the transistor MU may be turned on, while the transistor MD may be turned off. This causes the voltage (the signal SIGA) of the output terminal ToutA to be set as the high level voltage VH. Moreover, in the driver unit 16B, the transistor MU may be turned off, while the transistor MD may be turned on. This causes the voltage (the signal SIGB) of the output terminal ToutB to be set as the low level voltage VL. Furthermore, in the driver unit 16C, the transistors MU and MD may both be turned off. This causes the voltage (the signal SIGC) of the output terminal ToutC to be set as the medium level voltage VM, by resistors 41A to 41C of the reception device 40 described below.

FIG. 9 illustrates one configuration example of the reception device 40. The reception device 40 may include the resistors 41A, 41B, and 41C, amplifiers 42A, 42B, and 42C, a clock generator unit 43, flip flops 44 and 45, and a signal generator unit 46.

The resistors 41A, 41B, and 41C may function as terminators in the communication system 1. The resistor 41A may include one end coupled to an input terminal TinA and supplied with the signal SIGA, and another end coupled to another end of the resistor 41B and another end of the resistor 41C. The resistor 41B may include one end coupled to an input terminal TinB and supplied with the signal SIGB, and the other end coupled to the other ends of the resistors 41A and 41C. The resistor 41C may include one end coupled to an input terminal TinC and supplied with the signal SIGC, and the other end coupled to the other ends of the resistors 41A and 41B.

The amplifiers 42A, 42B, and 42C may each output a signal corresponding to a difference between a signal at a positive input terminal and a signal at a negative input terminal. The amplifier 42A may include the positive input terminal that is coupled to the negative input terminal of the amplifier 42C, coupled to the one end of the resistor 41A, and supplied with the signal SIGA, and the negative input terminal that is coupled to the positive input terminal of the amplifier 42B, coupled to the one end of the resistor 41B, and supplied with the signal SIGB. The amplifier 42B may include the positive input terminal that is coupled to the negative input terminal of the amplifier 42A, coupled to the one end of the resistor 41B, and supplied with the signal SIGB, and the negative input terminal that is coupled to the positive input terminal of the amplifier 42C, coupled to the one end of the resistor 41C, and supplied with the signal SIGC. The amplifier 42C may include the positive input terminal that is coupled to the negative input terminal of the amplifier 42B, coupled to the one end of the resistor 41C, and supplied with the signal SIGC, and the negative input terminal that is coupled to the positive input terminal of the amplifier 42A, coupled to the resistor 41A, and supplied with the signal SIGA.

With this configuration, the amplifier 42A may output the signal corresponding to the difference (SIGA−SIGB) between the signal SIGH and the signal SIGB. The amplifier 42B may output the signal corresponding to the difference (SIGB−SIGC) between the signal SIGB and the signal SIGC. The amplifier 42C may output the signal corresponding to the difference (SIGC−SIGA) between the signal SIGC and the signal SIGA.

FIG. 10 may illustrate one operation example of the amplifiers 42A, 42B and 42C. In this example, the signal SIGA may be the high level voltage VH, while the signal SIGH may be the low level voltage VL. At this occasion, the voltage of the signal SIGC may be set as the medium level voltage VM by the resistors 41A to 41C. In this case, a current fin may flow through the input terminal TinA, the resistor 41A, the resistor 41B, and the input terminal TinB in the order named. Moreover, the positive input terminal of the amplifier 42A may be supplied with the high level voltage VH, while the negative input terminal may be supplied with the low level voltage VL, causing the difference to be positive. Accordingly, the amplifier 42A may output "1". Moreover, the positive input terminal of the amplifier 42B may be supplied with the low level voltage VL, while the negative input terminal may be supplied with the medium level voltage VM, causing the difference to be negative. Accordingly, the amplifier 42B may output "0". Furthermore, the positive input terminal of the amplifier 42C may be supplied with the medium level voltage VM, while the negative input terminal may be supplied with the high level voltage VH, causing the difference to be negative. Accordingly, the amplifier 42C may output "0".

The clock generator unit 43 may generate a clock RxCK on the basis of the output signals of the amplifiers 42A, 42B, and 42C.

The flip flop 44 may allow the output signals of the amplifiers 42A, 42B, and 42C to be delayed by a term of one clock of the clock RxCK, and output the respective resultant signals. The output signals of the flip flop 44 may indicate a symbol RS. Here, the symbol RS may indicate any one of the six symbols "+x", "−x", "+y", "−y", "+z", and "−z", as with the symbols NS0 to NS6.

The flip flop 45 may allow the three output signals of the flip flop 44 to be delayed by the term of one clock of the clock RxCK, and output the respective resultant signals. In other words, the flip flop 45 may allow the symbol RS to be delayed by the term of one clock of the clock RxCK, to generate a symbol RS2. The symbol RS2 may be a precedingly received symbol, and indicate any one of the six symbols "+x", "−x", "+y", "−y", "+z", and "−z", as with the symbol RS.

The signal generator unit 46 may generate transition signals RxF, RxR, and RxP, on the basis of the output signals of the flip flops 44 and 45 and on the basis of the clock RxCK. The transition signals RxF, RxR, and RxP may respectively correspond to the transition signals TxF, TxR, and TxP in the transmission device 10, and indicate the transitions of the symbol. The signal generator unit 46 may identify the transition of the symbol (FIG. 4) on the basis of the symbol RS indicated by the output signals of the flip flop 44 and on the basis of the preceding symbol RS2 indicated by the output signals of the flip flop 45, to generate the transition signals RxF, RxR, and RxP.

Here, the single set of the transition signals TxF0, TxR0, and TxP0 corresponds to one specific example of "transition signals" in the disclosure. The single set of the transition signals TxF1, TxR1, and TxP1 corresponds to one specific example of "transition signals" in the disclosure. The single set of the transition signals TxF2, TxR2, and TxP2 corresponds to one specific example of "transition signals" in the disclosure. The single set of the transition signals TxF3, TxR3, and TxP3 corresponds to one specific example of "transition signals" in the disclosure. The single set of the transition signals TxF4, TxR4, and TxP4 corresponds to one specific example of "transition signals" in the disclosure. The single set of the transition signals TxF5, TxR5, and TxP5 corresponds to one specific example of "transition signals" in the disclosure. The single set of the transition signals TxF6, TxR6, and TxP6 corresponds to one specific example of "transition signals" in the disclosure. The single set of the symbol signals Tx10, Tx20, and Tx30 corresponds to one specific example of "transmission symbol signals" in the disclosure. The single set of the symbol signals Tx11, Tx21, and Tx31 corresponds to one specific example of "transmission symbol signals" in the disclosure. The single set of the symbol signals Tx12, Tx22, and Tx32 corresponds to one specific example of "transmission symbol signals" in the disclosure. The single set of the symbol signals Tx13, Tx23, and Tx33 corresponds to one specific example of "transmission symbol signals" in the disclosure. The single set of the symbol signals Tx14, Tx24, and Tx34 corresponds to one specific example of "transmission symbol signals" in the disclosure. The single set of the symbol signals Tx15, Tx25, and Tx35 corresponds to one specific example of "transmission symbol signals" in the disclosure. The single set of the symbol signals Tx16, Tx26, and Tx36 corresponds to one specific example of "transmission symbol signals" in the disclosure. The single set of the symbol signals Tx1, Tx2, and Tx3 corresponds to one specific example of a "serial signal" in the disclosure. The flip flop 38 corresponds to one specific example of a "first flip flop unit" in the disclosure.

[Operation and Workings]

Description is given next of operation and workings of the communication system 1 according to this embodiment.

[Outline of Overall Operation]

First, description is given on an outline of overall operation of the communication system 1 with reference to FIG. 1 and other figures. In the transmission device 10, the clock generator unit 17 may generate the clock TxCK. The divider circuit 18 may perform the division operation on the basis of the clock TxCK, to generate the clock CK. The transition signal generator unit 20 may generate the transition signals TxF0 to TxF6, TxR0 to TxR6, and TxP0 to TxP6, on the basis of the inputted signal and on the basis of the clock CK. The transmission symbol generator unit 30 may generate the symbol signals Tx10 to Tx16, Tx20 to Tx26, and Tx30 to Tx36, on the basis of the transition signals TxF0 to TxF6, TxR0 to TxR6, and TxP0 to TxP6 and on the basis of the clock CK. The serializer 11 may serialize the symbol signals Tx10 to Tx16 in this order, on the basis of the symbol signals Tx10 to Tx16 and on the basis of the clock CK, to generate the symbol signal Tx1. The serializer 12 may serialize the symbol signals Tx20 to Tx26 in this order, on the basis of the symbol signals Tx20 to Tx26 and on the basis of the clock CK, to generate the symbol signal Tx2. The serializer 13 may serialize the symbol signals Tx30 to Tx36 in this order, on the basis of the symbol signals Tx30 to Tx36 and on the basis of the clock CK, to generate the symbol signal Tx3. The output control unit 14 may generate the six signals PUA, PDA, PUB, PDB, PUC, and PDC on the basis of the symbol signals Tx1, Tx2, and Tx3 and on the basis of the clock TxCK. The pre-driver unit 154 may drive the driver unit 16A on the basis of the signals PUA and PDA. The driver unit 16A may generate the signal SIGA. The pre-driver unit 15B may drive the driver unit 16B on the basis of the signals PUB and PDB. The driver unit 16B may generate the signal SIGB. The pre-driver unit 15C may drive the driver unit 16C on the basis of the signals PUC and PDC. The driver unit 16C may generate the signal SIGC.

In the reception device 40 (FIG. 10), the amplifier 42A may output the signal corresponding to the difference between the signal SIGA and the signal SIGB. The amplifier 42B may output the signal corresponding to the difference between the signal SIGB and the signal SIGC. The amplifier 42C may output the signal corresponding to the difference between the signal SIGC and the signal SIGA. The clock generator unit 43 may generate the clock RxCK on the basis of the output signals of the amplifiers 42A, 42B, and 42C. The flip flop 44 may allow the output signals of the amplifiers 42A, 42B, and 42C to be delayed by the term of one clock of the clock RxCK, and output the respective resultant signals. The flip flop 45 may allow the three output signals of the flip flop 44 to be delayed by the term of one clock of the clock RxCK, and output the respective resultant signals. The signal generator unit 46 may generate the transition signals RxF, RxR, and RxP on the basis of the output signals of the flip flops 44 and 45 and on the basis of the clock RxCK.

[Detailed Operation of Transmission Symbol Generator Unit 30]

The transmission symbol generator unit 30 (FIG. 5) may generate the symbol signals Tx10 to Tx16, Tx20 to Tx26, and Tx30 to Tx36, on the basis of the transition signals TxF0 to TxF6, TxR0 to TxR6, and TxP0 to TxP6 and on the basis of the clock CK. In one specific example, the signal generator unit 31 may generate the single set of the symbol signals Tx10, Tx20, and Tx30 (the symbol NS0), on the basis of the single set of the transition signals TxF0, TxR0, and TxP0 and on the basis of the single set of the symbol signals D16, D26, and D36 (the symbol NS6 in the preceding term of the cycles of the clock CK). The signal generator unit 32 may generate the single set of the symbol signals Tx11, Tx21, and Tx31 (the symbol NS1), on the basis of the single set of the transition signals TxF1, TxR1, and TxP1 and on the basis of the single set of the symbol signals Tx10, Tx20, and Tx30 (the symbol NS0). The signal generator unit 33 may generate the single set of the symbol signals Tx12, Tx22, and Tx32 (the symbol NS2), on the basis of the single set of the transition signals TxF2, TxR2, and TxP2 and on the basis of the single set of the symbol signals Tx11, Tx21, and Tx31 (the symbol NS1). The signal generator unit 34 may generate the single set of the symbol signals Tx13, Tx23, and Tx33 (the symbol NS3), on the basis of the single set of the transition signals TxF3, TxR3, and TxP3 and on the basis of the single set of the symbol signals Tx12, Tx22, and Tx32 (the symbol NS2). The signal generator unit 35 may generate the single set of the symbol signals Tx14, Tx24, and Tx34 (the symbol NS4), on the basis of the single set of the transition signals TxF4, TxR4, and TxP4 and on the basis of the single set of the symbol signals Tx13, Tx23, and Tx33 (the symbol NS3). The signal generator unit 36 may generate the single set of the symbol signals Tx15, Tx25, and Tx35 (the symbol NS5), on the basis of the single set of the transition signals TxF5, TxR5, and TxP5 and on the basis of the single set of the symbol signals Tx14, Tx24, and Tx34 (the symbol NS4). The signal generator unit 37 may generate the single set of the symbol signals Tx16, Tx26, and Tx36 (the symbol NS6), on the basis of the single set of the transition signals TxF6, TxR6, and TxP6 and on the basis of the single set of the symbol signals Tx15, Tx25, and Tx35 (the symbol NS5). Moreover, the flip flop 38 may allow the single set of the symbol signals Tx16, Tx26, and Tx36 (the symbol NS6) to be delayed by the term of one clock of the clock CK, to output the resultant signals as the single set of the symbol signals D16, D26, and D36.

As described, in the transmission symbol generator unit 30, in a certain term of the cycles of the clock CK, the signal generator units 31 to 37 may sequentially generate the symbols NS0 to NS6. The flip flop 38 may supply the symbol NS6 generated by the signal generator unit 37 to the signal generator unit 31 in the next term of the cycles. In other words, the seven signal generator units 31 to 37 and the single flip flop 38 may constitute a loop, allowing these circuits to operate in each term of the cycles of the clock CK having a low frequency. This makes it possible to reduce possibility of occurrence of erroneous operation, even in a case with the frequency of the clock CK (the clock TxCK) being high, as described below in comparison with a comparative example.

Comparative Example

Description is given next of the workings of this embodiment, in comparison with a transmission device 10R according to the comparative example.

FIG. 11 illustrates one configuration example of the transmission device 10R according to the comparative example. The transmission device 10R may include serializers 11R to 13R and a transmission symbol generator unit 30R. In the transmission device 10R according to the comparative example, the transmission symbol generator unit 30R may be provided at a different position from that of this embodiment. Specifically, in the transmission device 10 (FIG. 3) according to this embodiment, the transmission symbol generator unit 30 may be provided between the transition signal generator unit 20 and the serializers 11 to 13. In contrast, in the transmission device 10R (FIG. 11) according to the comparative example, the transmission symbol generator unit 30R may be provided between the serializers 11R to 13R and the output control unit 14.

The serializer 11R may serialize the transition signals TxF0 to TxF6 in this order, on the basis of the transition signals TxF0 to TxF6 and on the basis of the clock TxCK, to generate a transition signal TxF9. The serializer 12R may serialize the transition signals TxR0 to TxR6 in this order, on the basis of the transition signals TxR0 to TxR6 and on the basis of the clock TxCK, to generate a transition signal TxR9. The serializer 13R may serialize the transition signals TxP0 to TxP6 in this order, on the basis of the transition signals TxP0 to TxP6 and on the basis of the clock TxCK, to generate a transition signal TxP9.

The transmission symbol generator unit 30R may generate the symbol signals Tx1, Tx2, and Tx3, on the basis of the transition signals TxF9, TxR9, and TxP9 and on the basis of the clock CK. The transmission symbol generator unit 30R may include a signal generator unit 31R and a flip flop 38R. The signal generator unit 31R may generate the symbol signals Tx1, Tx2, and Tx3, on the basis of the transition signals TxF9, TxR9, and TxP9 and on the basis of symbol signals D1, D2, and D3, as with the signal generator unit 31 according to this embodiment. In one specific example, the signal generator unit 31R may obtain the symbol after the transition as illustrated in FIG. 4, on the basis of the symbol indicated by the symbol signals D1, D2, and D3 and on the basis of the transition signals TxF9, TxR9, and TxP9, and output the resultant symbol as the symbol signals Tx1, Tx2, and Tx3. The flip flop 38R may perform samplings of the symbol signals Tx1, Tx2, and Tx3 on the basis of the clock TxCK, and output the results of the samplings respectively as the symbol signals D1, D2, and D3.

As described, in the transmission device 10R according to the comparative example, the transmission symbol generator unit 30R may be provided between the serializers 11R to 13R and the output control unit 14. Accordingly, in the transmission symbol generator unit 30R, in a certain term of the cycles of the clock TxCK having the high frequency, the signal generator unit 31R may generate the symbol. The flip flop 38R may supply the symbol to the signal generator unit 31R in the next term of the cycles. In other words, the single signal generator unit 31R and the single flip flop 38R may constitute a loop, allowing these circuits to operate in each term of the cycles of the clock CK having the high frequency. In this case, a circuit delay in the loop may cause possibility that these circuits fail to finish their operation in each term of the cycles of the clock TxCK.

In contrast, in the transmission device 10 according to this embodiment, the transmission symbol generator unit 30 may be provided between the transition signal generator unit 20 and the serializers 11 to 13. Accordingly, in the transmission symbol generator unit 30, the seven signal generator units 31 to 37 and the single flip flop 38 may operate in each term of the cycles of the clock CK having the low frequency. In this example, duration of each term of the cycles of the clock CK may be seven times as long as duration of each term of the cycles of the clock TxCK. This allows for one-seventh (1/7) alleviation of set-up time, hold time, and an allowance for a design margin of the flip flop, in the transmission symbol generator unit 30, relatively to the case of the comparative example. As a result, in the transmission symbol generator unit 30, it is possible to reduce the possibility that these circuits fail to finish their operation in each term of the cycles. This leads to reduction in the possibility of the occurrence of the erroneous operation, even in the case with the frequency of the clock CK (the clock TxCK) being high.

[Effects]

As described, in this embodiment, the transmission symbol generator unit is provided in a fore stage of the serializers. Hence, it is possible to reduce the possibility of the occurrence of the erroneous operation, even in the case with the frequency of the clock being high. As a result, it is possible to increase transmission capacity.

2. Second Embodiment

Description is given next of a communication system 2 according to a second embodiment. This embodiment differs from the case of the first embodiment in a configuration of the transmission symbol generator unit. It is to be noted that component parts that are substantially same as those of the communication system 1 according to the forgoing first embodiment are denoted by the same reference characters, and description thereof is omitted as appropriate.

As illustrated in FIGS. 1 and 3, the communication system 2 may include a transmission device 50 including a transmission symbol generator unit 60. The transmission symbol generator unit 60 may generate the symbol signals Tx10 to Tx16, Tx20 to Tx26, and Tx30 to Tx36, on the basis of the transition signals TxF0 to TxF6, TxR0 to TxR6, and TxP0 to TxP6 and on the basis of the clock CK, as with the transmission symbol generator unit 30 according to the first embodiment.

FIG. 12 illustrates one configuration example of the transmission symbol generator unit 60. The transmission symbol generator unit 60 may include symbol generator units 61 to 66, a selector 67, and a flip flop 68.

The symbol generator unit 61 may generate seven sets of symbol signals that indicate symbols NS10 to NS16, on the basis of the transition signals TxF7 to TxF6, TxR0 to TxR6, and TxP0 to TxP6 and on the basis of a single set of symbol signals that indicates the symbol "+x". Similarly, the symbol generator unit 62 may generate seven sets of symbol signals that indicate symbols NS20 to NS26, on the basis of the transition symbols TxF0 to TxF6, TxR0 to TxR6, and TxP0 to TxP6 and on the basis of a single set of symbol signals that indicates the symbol "−x". The symbol generator unit 63 may generate seven sets of symbol signals that indicate symbols NS30 to NS36, on the basis of the transition signals TxF0 to TxF6, TxR0 to TxR6, and TxP0 to TxP6 and on the basis of a single set of symbol signals that indicates the symbol "+y". The symbol generator unit 64 may generate seven sets of symbol signals that indicate symbols NS40 to NS46, on the basis of the transition signals TxF0 to TxF6, TxR0 to TxR6, and TxP0 to TxP6 and on the basis of a single set of symbol signals that indicates the symbol "−y". The symbol generator unit 65 may generate seven sets of symbol signals that indicate symbols NS50 to NS56, on the basis of the transition signals TxF0 to TxF6, TxR0 to TxR6, and TxP0 to TxP6 and on the basis of a single set of symbol signals that indicates the symbol "+z". The symbol generator unit 66 may generate seven sets of symbol signals that indicate symbols NSW to NS66, on the basis of the transition signals TxF0 to TxF6. TxR0 to TxR6, and TxP0 to TxP6 and on the basis of a single set of symbol signals that indicates the symbol "−z".

FIG. 13 illustrates one configuration example of the symbol generator unit 61. It is to be noted that description is made with the symbol generator unit 61 given as an example, but the same may apply to the symbol generator units 62 to 66. The symbol generator unit 61 may include signal generator units 71 to 77 and flip flops 81 to 83.

The signal generator unit 71 may generate the single set of the symbol signals that indicates the symbol NS10, on the basis of the single set of the transition signals TxF0, TxR0, and TxP0 and on the basis of the single set of the symbol signals that indicates the symbol "+x", as with, for example, the signal generator unit 31 according to the first embodiment. Similarly, the signal generator unit 72 may generate the single set of the symbol signals that indicates the symbol NS11, on the basis of the single set of the transition signals TxF1, TxR1, and TxP1 and on the basis of the single set of the symbol signals that indicates the symbol NS10. The flip flop 81 may perform, on the basis of the clock CK, samplings of the two sets of the symbol signals that indicate the symbols NS10 and NS11, and samplings of the transition signals TxF2 to TxF6, TxR2 to TxR6, and TxP2 to TxP6. The flip flop 81 may output results of the respective samplings.

The signal generator 73 may generate the single set of the symbol signals that indicates the symbol NS12, on the basis of the single set of the transition signals TxF2, TxR2, and TxP2 supplied from the flip flop 81 and on the basis of the single set of the symbol signals that indicates the symbol NS11 supplied from the flip flop 81, as with, for example, the signal generator unit 71. Similarly, the signal generator 74 may generate the single set of the symbol signals that indicates the symbol NS13, on the basis of the single set of the transition signals TxF3, TxR3, and TxP3 supplied from the flip flop 81 and on the basis of the single set of the symbol signals that indicates the symbol NS12. The flip flop 82 may perform, on the basis of the clock CK, samplings of the two sets of the symbol signals that indicate the symbols NS12 and NS13, samplings of the two sets of the symbol signals that indicate the symbols NS10 and NS11 supplied from the flip flop 81, and samplings of the transition signals TxF4 to TxF6, TxR4 to TxR6, and TxP4 to TxP6 supplied from the flip flop 81. The flip flop 82 may output results of the respective samplings.

The signal generator unit 75 may generate the single set of the symbol signals that indicates the symbol NS14, on the basis of the single set of the transition signals TxF4, TxR4, and TxP4 supplied from the flip flop 82 and on the basis of the single set of the symbol signals that indicates the symbol NS13 supplied from the flip flop 82, as with, for example, the signal generator unit 71. Similarly, the signal generator unit 76 may generate the single set of the symbol signals that indicates the symbol NS15, on the basis of the single set of the transition signals TxF5, TxR5, and TxP5 supplied from the flip flop 82 and on the basis of the single set of the symbol signals that indicates the symbol NS14. The flip flop 83 may perform, on the basis of the clock CK, samplings of the two sets of the symbol signals that indicate the symbols NS14 and NS15, samplings of the four sets of the symbol signals that indicate the symbols NS10 to NS13 supplied from the flip flop 82, and samplings of the single set of TxF6, TxR6, and TxP6 supplied from the flip flop 82. The flip flop 83 may output results of the respective samplings.

The signal generator unit 77 may generate the single set of the symbol signals that indicates the symbol NS16, on the basis of the single set of the transition signals TxF6, TxR6, and TxP6 supplied from the flip flop 83 and on the basis of the single set of the symbol signals that indicates the symbol NS15 supplied from the flip flop 82, as with, for example, the signal generator unit 71.

The selector 67 (FIG. 12) may select, on the basis of the symbol NS7 indicated by the single set of the symbol signals D16, D26, and D36, one of the following, as the symbols NS1 to NS6: the symbols NS10 to NS16 supplied from the symbol generator unit 61; the symbols NS20 to NS26 supplied from the symbol generator unit 62; the symbols NS30 to NS36 supplied from the symbol generator unit 63; the symbols NS40 to NS46 supplied from the symbol generator unit 64; the symbols NS50 to NS56 supplied from the symbol generator unit 65; and the symbols NS60 to NS66 supplied from the symbol generator unit 66. In one specific example, the selector 67 may select the symbols NS10 to NS16 in a case with the symbol NS7 being "+x". The selector 67 may select the symbols NS20 to NS26 in a case with the symbol NS7 being "−x". The selector 67 may select the symbols NS30 to NS36 in a case with the symbol NS7 being "+y". The selector 67 may select the symbols NS40 to NS46 in a case with the symbol NS7 being "−y". The selector 67 may select the symbols NS50 to NS56 in a case with the symbol NS7 being "+z". The selector 67 may select the symbols NS60 to NS66 in a case with the symbol NS7 being "−z". Moreover, the selector 67 may output the symbols NS1 to NS6 thus selected, with the utilization of the symbol signals Tx10 to Tx16, Tx20 to Tx26, and Tx30 to Tx36 as with the transmission symbol generator unit 30 according to the first embodiment.

The flip flop 68 may perform, on the basis of the clock CK, samplings of the single set of the symbol signals Tx16, Tx26, and Tx36 (the symbol NS6), and output a result of the samplings respectively as the single set of the symbol signals D1, D2, and D3 (the symbol NS7).

Here, the seven sets of the symbol signals that indicate the symbols NS10 to NS16 correspond to one specific example of a "predetermined number of symbol signals" in the disclosure. The seven sets of the symbol signals that indicate the symbols NS20 to NS26 correspond to one specific example of a "predetermined number of symbol signals" in the disclosure. The seven sets of the symbol signals that indicate the symbols NS30 to NS36 correspond to one specific example of a "predetermined number of symbol signals" in the disclosure. The seven sets of the symbol signals that indicate the symbols NS40 to NS46 correspond to one specific example of a "predetermined number of symbol signals" in the disclosure. The seven sets of the symbol signals that indicate the symbols NS50 to NS56 correspond to one specific example of a "predetermined number of symbol signals" in the disclosure. The seven sets of the symbol signals that indicate the symbols NS60 to NS66 correspond to one specific example of a "predetermined number of symbol signals" in the disclosure. The flip flop 68 corresponds to one specific example of a. "second flip flop unit" in the disclosure. The flip flops 81, 82, and 83 each correspond to one specific example of a "third flip flop unit" in the disclosure.

With this configuration, in the transmission symbol generator unit 60, the symbol generator units 61 to 66 may respectively generate the symbols NS10 to NS16, the symbols NS20 to NS26, the symbols NS30 to NS36, the symbols NS40 to NS46, the symbols NS50 to NS56, and the symbols NS60 to NS66, on the basis of the transition signals TxF0 to TxF6, TxR0 to TxR6, and TxP0 to TxP6. At this occasion, the symbol generator units 61 to 66 may be respectively supplied with the symbols "+x", "−x", "+y", "−y", "+z", and "−z". In other words, the symbol generator unit 61 may generate the symbols NS10 to NS16 in advance, assuming on a case in which the symbol signals D16, D26, and D36 indicate the symbol "+x". The symbol generator unit 62 may generate the symbols NS20 to NS26 in advance, assuming on a case in which the symbol signals D16, D26, and D36 indicate the symbol "−x". The symbol generator unit 63 may generate the symbols NS30 to NS36 in advance, assuming on a case in which the symbol signals D16, D26, and D36 indicate the symbol "+y". The symbol generator unit 64 may generate the symbols NS40 to NS46 in advance, assuming on a case in which the symbol signals D16, D26, and D36 indicate the symbol "−y". The symbol generator unit 65 may generate the symbols NS50 to NS56 in advance, assuming on a case in which the symbol signals D16, D26, and D36 indicate the symbol "+z". The symbol generator unit 66 may generate the symbols NS60 to NS66 in advance, assuming on a case in which the symbol signals D16, D26, and D36 indicate the symbol "−z". Moreover, the selector 67 may select, on the basis of the symbol NS7 indicated by the symbol signals D16, D26, and D36, one of the following as the symbols NS1 to NS6: the symbols NS10 to NS16, the symbols NS20 to NS26; the symbols NS30 to NS36; the symbols NS40 to NS46; the symbols NS50 to NS56, and the symbols NS60 to NS66.

As described, in the transmission symbol generator unit 60, the symbol generator units 61 to 66 may generate, in advance, the six sets of the symbols (the symbols NS10 to NS16, the symbols NS20 to NS26, the symbols NS30 to NS36, the symbols NS40 to NS46, the symbols NS50 to NS56, and the symbols NS60 to NS66). Moreover, in a certain term of the cycles of the clock CK, the selector 67 may select one of the six sets of the symbols as the symbols NS1 to NS6. The flip flop 38 may supply the symbol NS6 to the selector 67, as the symbol NS7 in the next term of the cycles. In other words, the single selector 67 and the single flip flop 68 may constitute a loop, allowing these circuits to operate in each term of the cycles of the clock CK having the low frequency. Accordingly, in the transmission symbol generator unit 60, it is possible to reduce an amount of the circuit delay in the loop. This makes it possible to reduce the possibility that these circuit may fail to finish their operation in each term of the cycles. It is therefore possible to reduce the possibility of the occurrence of the erroneous operation, even in the case with the frequency of the clock CK (the clock TxCK) being high.

Moreover, in the transmission symbol generator unit 60, each of the symbol generator units 61 to 66 may include the flip flops 81 to 83. This allows for the so-called pipe line processing. It is therefore possible to reduce the possibility of the occurrence of the erroneous operation, even in the case with the frequency of the clock CK (the clock TxCK) being high.

As described, in this embodiment, the symbol generator units may generate the six sets of the symbols in advance. Thereafter, the selector may select one set out of these. Hence, it is possible to reduce the possibility of the occurrence of the erroneous operation, even in the case with the frequency of the clock being high. As a result, it is possible to increase the transmission capacity.

In this embodiment, the symbol generator unit may include the flip flop, to perform the so-called pipe line processing. Hence, it is possible to reduce the possibility of the occurrence of the erroneous operation, even in the case with the frequency of the clock being high. As a result, it is possible to increase the transmission capacity.

Modification Example 2-1

In the forgoing embodiment, each of the symbol generator units 61 to 66 may include the three flip flops 81 to 83. However, this is non-limiting. Instead, in one alternative example, two flip flops may be provided. In another alternative, four or more flip flops may be provided. Moreover, a position at which the flip flop is inserted is not limited to as exemplified in FIG. 13, but may be altered as appropriate.

Modification Example 2-2

In the forgoing embodiment, each of the symbol generator units 61 to 66 may include the flip flops 81 to 83. However, this is non-limiting. Instead, in one alternative example, as illustrated in FIG. 14, a symbol generator unit 61A may be devoid of flip flops.

3. Application Example

Description is given next of an application example of the communication systems described in the forgoing embodiments and modification examples.

FIG. 15 illustrates a smartphone 300 (a multifunction mobile phone) to which the communication systems according to the forgoing example embodiments are applied. The smartphone 300 may be equipped with various devices. The communication systems according to the forgoing example embodiments may be applied to a communication system that performs data exchange among the devices.

FIG. 16 illustrates one configuration example of an application processor 310 utilized in the smartphone 300. The application processor 310 may include a CPU (Central Processing Unit) 311, a memory control unit 312, a power supply control unit 313, an external interface 314, a GPU (Graphics Processing Unit) 315, a media processor unit 316, a display control unit 317, and an MIPI (Mobile Industry Processor Interface) 318. The CPU 311, the memory control unit 312, the power supply control unit 313, the external interface 314, the GPU 315, the media processor unit 316, and the display control unit 317 may be coupled to a system bus 319 in this example, and be able to perform the data exchange with one another through the system bus 319.

The CPU 311 may process various pieces of information handled by the smartphone 300 in accordance with a program. The memory control unit 312 may control a memory 501 which the CPU 311 uses in performing information processing. The power supply control unit 313 may control a power supply of the smartphone 300.

The external interface 314 may be an interface provided for communication with an external device. In this example, the external interface 314 may be coupled to a wireless communication unit 502 and an image sensor 410. The wireless communication unit 502 may perform wireless communication with a base station of mobile phones. The wireless communication unit 502 may be so constituted that the wireless communication unit 502 includes a baseband unit and an RF (Radio Frequency) front end unit, without limitation. The image sensor 410 may acquire an image. The image sensor 410 may be so constituted that the image sensor 410 includes a CMOS sensor, without limitation.

The GPU 315 may perform image processing. The media processor unit 316 may process information such as sound, characters, and figures. The display control unit 317 may control a display 504 through the MIPI interface 318. The MIPI interface 318 may transmit an image signal to the display 504. As the image signal, for example, a signal of a YUV system, an RGB system, or other systems may be used. In one example, the communication systems according to the forgoing example embodiments may be applied to a communication system between the MIPI interface 318 and the display 504.

FIG. 17 illustrates one configuration example of the image sensor 410. The image sensor 410 may include a sensor unit 411, an ISP (Image Signal Processor) 412, a JPEG (Joint Photographic Experts Group) encoder 413, a CPU 414, a RAM (Random Access Memory) 415, a ROM (Read Only Memory) 416, a power supply control unit 417, an I$^2$C (Inter-Integrated Circuit) interface 418, and an MIPI interface 419. These blocks may each be coupled to a system bus 420 in this example, and be able to perform the data exchange with one another through the system bus 420.

The sensor unit 411 may acquire the image, and be constituted by, for example, the CMOS sensor. The ISP 412 may perform predetermined processing on the image acquired by the sensor unit 411. The JPEG encoder 413 may encode the image processed by the ISP 412, to generate an image of a JPEG form. The CPU 414 may control each block of the image sensor 410 in accordance with a program. The RAM 415 may be a memory which the CPU 414 uses in performing image processing. The ROM 416 may store the program to be executed in the CPU 414. The power supply control unit 417 may control a power supply of the image sensor 410. The I$^2$C interface 418 may receive a control signal from the application processor 310. Moreover, although not illustrated, the image sensor 410 may receive, from the application processor 310, a clock signal in addition to the control signal. In one specific example, the image sensor 410 may be so constituted that the image sensor 410 is able to operate on the basis of the clock signals having various frequencies. The MIPI interface 419 may transmit the image signal to the application processor 310. As the image signal, for example, the signal of the YUV system, the RGB system, or other systems may be used. In one example, the communication systems according to the forgoing example embodiments may be applied to a communication system between the MIPI interface 419 and the application processor 310.

Although description has been made by giving the embodiments and the modification examples, and the application example to the electronic apparatus as mentioned above, the contents of the technology are not limited to the above-mentioned example embodiments and may be modified in a variety of ways.

For example, in the forgoing example embodiments, the transition signal generator unit 20 may generate the seven sets of the transition signals TxF, TxR, and TxP. However, this is non-limiting. In one alternative example, the transition signal generator unit 20 may generate a plurality of, but six or less, sets of the transition signals. In another alternative, the transition signal generator unit 20 may generate eight or more sets of the transition signals. In one exemplary case in which the transition signal generator unit 20 has generated eight sets of the transition signals, the following may be desirable. The divider circuit 18 may perform division operation by eight, to generate the clock CK. The transmission symbol generator unit 30 may generate eight sets of the symbol signals on the basis of the eight sets of the transition signals. Each of the serializers 11 to 13 may serialize eight symbol signals.

Moreover, for example, in the forgoing example embodiments, the communication may be performed with the utilization of the three signals SIGA, SIGB, and SIGC. However, this is non-limiting. Instead, the communication may be performed with the utilization of, for example, two signals. In another alternative, the communication may be performed with the utilization of four or more signals.

Furthermore, for example, in the forgoing example embodiments, the transistors MU and MD may be both turned off in the case in which, for example, the voltage of the output terminal is set as the medium level voltage VM. However, this is non-limiting. In one alternative, the transistors MU and MD may be both turned on. This provides Thevenin termination, making it possible to set the voltage of the output terminal as the medium level voltage VM.

It is to be noted that effects described herein are merely exemplified. Effects of the technology are not limited to the effects described herein. Effects of the technology may further include other effects than the effects described herein.

Moreover, the technology may have the following configurations.

(1) A transmission device, including:
a transmission symbol generator unit that generates, on a basis of a predetermined number of transition signals each of which indicates a transition in a sequence of transmission symbols, transmission symbol signals that are equal in number to the predetermined number;
a serializer unit that serializes the predetermined number of the transmission symbol signals, to generate a serial signal; and
a driver unit that operates on a basis of the serial signal.

(2) The transmission device according to (1), in which
the transmission symbol generator unit includes signal generator units that are equal in number to the predetermine number, the signal generator units being provided in association with the predetermined number of the transition signals, and each of the signal generator units generating one of the predetermined number of the transmission symbol signals, and
each of the signal generator units generates the transmission symbol signal, on a basis of the transition signal associated with the relevant signal generator unit and on a basis of the transmission symbol signal generated by another one of the signal generator units.

(3) The transmission device according to (2), in which
the transmission symbol generator unit includes a first flip flop unit, the first flip flop unit performing a sampling of the symbol signal generated by one of the predetermined number of the signal generator units, and supplying a result of the sampling to another one of the signal generator units.

(4) The transmission device according to (3), in which
the serializer unit operates on a basis of a first clock signal having a first frequency, and
the first flip flop unit operates on a basis of a second clock signal having a second frequency lower than the first frequency.

(5) The transmission device according to (1), in which
the transmission symbol generator unit includes:
a plurality of symbol generator units each of which generates, on a basis of the predetermined number of the transition signals and on a basis of a predetermined symbol signal that differs for the plurality of the symbol generator units, symbol signals that are equal in number to the predetermined number; and
a selector that selects, from a plurality of sets of the predetermined number of the symbol signals, a single set of the predetermined number of the symbol signals as the predetermined number of the transmission symbol signals, the plurality of sets of the predetermined number of the symbol signals being generated by the plurality of the symbol generator units.

(6) The transmission device according to (5), in which
the transmission symbol generator unit further includes a second flip flop unit that performs a sampling of one transmission symbol signal out of the predetermined number of the transmission symbol signals, and
the selector selects, on a basis of a result of the sampling in the second flip flop unit, the single set of the predetermined number of the symbol signals, from the plurality of sets of the predetermined number of the symbol signals.

(7) The transmission device according to (6), in which
the serializer unit operates on a basis of a first clock signal having a first frequency, and
the second flip flop unit operates on a basis of a second clock signal having a second frequency lower than the first frequency.

(8) The transmission device according to any one of (5) to (7), in which
each of the symbol generator units includes signal generator units that are equal in number to the predetermined number, the signal generator units being provided in association with the predetermined number of the transition signals, and each of the symbol generator units generating one of the predetermined number of the symbol signals,
one signal generator unit out of the predetermined number of the signal generator units generates the symbol signal, on a basis of the transition signal associated with the relevant signal generator unit and on a basis of the predetermined symbol signal, and
each of remaining signal generator units out of the predetermined number of the signal generator units generates the symbol signal, on a basis of the transition signal associated with the relevant signal generator unit and on a basis of the symbol signal generated by another one of the signal generator units.

(9) The transmission device according to (8), in which
each of the symbol generator units further includes one or more third flip flop units provided for pipe line operation.

(10) The transmission device according to any one of (1) to (10), in which each of the predetermined number of the transition signals includes a first transition signal, a second transition signal, and a third transition signal, and
each of the predetermined number of the transmission symbol signals includes a first transmission symbol signal, a second transmission symbol signal, and a third transmission symbol signal.

(11) The transmission device according to (10), in which the serial signal includes a first serial signal, a second serial signal, and a third serial signal, and
the serializer unit
serializes first transmission symbol signals that are included in the predetermined number of the transmission symbol signals and are equal in number to the predetermined number, to generate the first serial signal,
serializes second transmission symbol signals that are included in the predetermined number of the transmission symbol signals and are equal in number to the predetermined number, to generate the second serial signal, and
serializes third transmission symbol signals that are included in the predetermined number of the transmission symbol signals and are equal in number to the predetermined number, to generate the third serial signal.
(12) The transmission device according to any one of (1) to (11), further including a control unit that controls operation of the driver unit, in accordance with the transmission symbols indicated by the serial signal.
(13) The transmission device according to (12), in which the control unit generates a first control signal, a second control signal, and a third control signal, and
the driver unit includes
a first driver that operates on a basis of the first control signal,
a second driver that operates on a basis of the second control signal, and
a third driver that operates on a basis of the third control signal.
(14) A transmission method, including:
generating, on a basis of a predetermined number of transition signals each of which indicates a transition in a sequence of transmission symbols, transmission symbol signals that are equal in number to the predetermined number;
serializing the predetermined number of the transmission symbol signals, to generate a serial signal; and
controlling operation of a driver unit, in accordance with the transmission symbols indicated by the serial signal.
(15) A communication system, including:
a transmission device; and
a reception device,
the transmission device including
a transmission symbol generator unit that generates, on a basis of a predetermined number of transition signals each of which indicates a transition in a sequence of transmission symbols, transmission symbol signals that are equal in number to the predetermined number;
a serializer unit that serializes the predetermined number of the transmission symbol signals, to generate a serial signal; and
a driver unit that operates on a basis of the serial signal.
(16) The communication system according to (15), in which
the transmission device is an image sensor, and
the reception device is a processor that processes an image acquired by the image sensor.

This application claims the benefit of Japanese Priority Patent Application JP2014-224924 filed on Nov. 5, 2014, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A transmission device, comprising:
a transmission symbol generator unit that generates, on a basis of a predetermined number of transition signals each of which indicates a transition in a sequence of transmission symbols, transmission symbol signals that are equal in number to the predetermined number;
a serializer unit that serializes the predetermined number of the transmission symbol signals, to generate a serial signal; and
a driver unit that operates on a basis of the serial signal,
wherein the transmission symbol generator unit includes
signal generator units that are equal in number to the predetermined number, the signal generator units being provided in association with the predetermined number of the transition signals, and each of the signal generator units generating one of the predetermined number of the transmission symbol signals, and
each of the signal generator units generates the transmission symbol signal, on a basis of the transition signal associated with said each signal generator unit and on a basis of the transmission symbol signal generated by another one of the signal generator units.

2. The transmission device according to claim 1, wherein the transmission symbol generator unit includes a first flip flop unit, the first flip flop unit performing a sampling of the symbol signal generated by one of the predetermined number of the signal generator units, and supplying a result of the sampling to another one of the signal generator units.

3. The transmission device according to claim 2, wherein the serializer unit operates on a basis of a first clock signal having a first frequency, and
the first flip flop unit operates on a basis of a second clock signal having a second frequency lower than the first frequency.

4. A transmission device, comprising:
a transmission symbol generator unit that generates, on a basis of a predetermined number of transition signals each of which indicates a transition in a sequence of transmission symbols, transmission symbol signals that are equal in number to the predetermined number;
a serializer unit that serializes the predetermined number of the transmission symbol signals, to generate a serial signal; and
a driver unit that operates on a basis of the serial signal,
wherein the transmission symbol generator unit includes:
a plurality of symbol generator units each of which generates, on a basis of the predetermined number of the transition signals and on a basis of a predetermined symbol signal that differs for the plurality of the symbol generator units, symbol signals that are equal in number to the predetermined number; and
a selector that selects, from a plurality of sets of the predetermined number of the symbol signals, a single set of the predetermined number of the symbol signals as the predetermined number of the transmission symbol signals, the plurality of sets of the predetermined number of the symbol signals being generated by the plurality of the symbol generator units.

5. The transmission device according to claim 4, wherein the transmission symbol generator unit further includes a flip flop unit that performs a sampling of one transmission symbol signal out of the predetermined number of the transmission symbol signals, and the selector selects, on a basis of a result of the sampling in the flip flop unit, the single set of the predetermined number of the symbol signals, from the plurality of sets of the predetermined number of the symbol signals.

6. The transmission device according to claim 5, wherein the serializer unit operates on a basis of a first clock signal having a first frequency, and the flip flop unit operates on a basis of a second clock signal having a second frequency lower than the first frequency.

7. The transmission device according to claim 4, wherein each of the symbol generator units includes signal generator units that are equal in number to the predetermined number, the signal generator units being provided in association with the predetermined number of the transition signals, and each of the symbol generator units generating one of the predetermined number of the symbol signals, one signal generator unit out of the predetermined number of the signal generator units generates the symbol signal, on a basis of the transition signal associated with the one signal generator unit and on a basis of the predetermined symbol signal, and each of remaining signal generator units out of the predetermined number of the signal generator units generates the symbol signal, on a basis of the transition signal associated with said each signal generator unit and on a basis of the symbol signal generated by another one of the signal generator units.

8. The transmission device according to claim 7, wherein each of the symbol generator units further includes one or more third flip flop units provided for pipe line operation.

9. The transmission device according to claim 1, wherein each of the predetermined number of the transition signals includes a first transition signal, a second transition signal, and a third transition signal, and each of the predetermined number of the transmission symbol signals includes a first transmission symbol signal, a second transmission symbol signal, and a third transmission symbol signal.

10. The transmission device according to claim 9, wherein the serial signal includes a first serial signal, a second serial signal, and a third serial signal, and the serializer unit serializes first transmission symbol signals that are included in the predetermined number of the transmission symbol signals and are equal in number to the predetermined number, to generate the first serial signal, serializes second transmission symbol signals that are included in the predetermined number of the transmission symbol signals and are equal in number to the predetermined number, to generate the second serial signal, and serializes third transmission symbol signals that are included in the predetermined number of the transmission symbol signals and are equal in number to the predetermined number, to generate the third serial signal.

11. The transmission device according to claim 1, further comprising a control unit that controls operation of the driver unit, in accordance with the transmission symbols indicated by the serial signal.

12. The transmission device according to claim 11, wherein the control unit generates a first control signal, a second control signal, and a third control signal, and the driver unit includes a first driver that operates on a basis of the first control signal, a second driver that operates on a basis of the second control signal, and a third driver that operates on a basis of the third control signal.

13. A transmission method, comprising:

generating, on a basis of a predetermined number of transition signals each of which indicates a transition in a sequence of transmission symbols, transmission symbol signals that are equal in number to the predetermined number;

serializing the predetermined number of the transmission symbol signals, to generate a serial signal; and controlling operation of a driver unit, in accordance with the transmission symbols indicated by the serial signal, wherein generating the transmission symbol signals comprises generating, by a plurality of symbol generators, on a basis of the predetermined number of the transition signals and on a basis of a predetermined symbol signal that differs for the plurality of the symbol generator, symbol signals that are equal in number to the predetermined number; and selecting, from a plurality of sets of the predetermined number of the symbol signals, a single set of the predetermined number of the symbol signals as the predetermined number of the transmission symbol signals, the plurality of sets of the predetermined number of the symbol signals being generated by the plurality of the symbol generator.

14. A communication system, comprising:

a transmission device according to claim 4; and a reception device.

15. The communication system according to claim 14, wherein the transmission device is an image sensor, and the reception device is a processor that processes an image acquired by the image sensor.

16. A transmission device, comprising:

transmission symbol generator circuitry configured to generate, on a basis of a predetermined number of transition signals each of which indicates a transition in a sequence of transmission symbols, transmission symbol signals that are equal in number to the predetermined number;

serializer circuitry configured to serialize the predetermined number of the transmission symbol signals, to generate a serial signal; and driver circuitry that operates on a basis of the serial signal, wherein the transmission symbol generator circuitry includes signal generators that are equal in number to the predetermined number, the signal generators being provided in association with the predetermined number of the transition signals, and each of the signal generators generating one of the predetermined number of the transmission symbol signals, and each of the signal generators generates the transmission symbol signal, on a basis of the transition signal associated with said each signal generator and on a basis of the transmission symbol signal generated by another one of the signal generators.

17. The transmission device according to claim 16, wherein the transmission symbol generator circuitry includes a first flip flop, the first flip flop performing a sampling of the symbol signal generated by one of the predetermined number of the signal generators, and supplying a result of the sampling to another one of the signal generators.

18. The transmission device according to claim 17, wherein
the serializer circuitry operates on a basis of a first clock signal having a first frequency, and
the first flip flop operates on a basis of a second clock signal having a second frequency lower than the first frequency.

19. A transmission device, comprising:
transmission symbol generator circuitry configured to generate, on a basis of a predetermined number of transition signals each of which indicates a transition in a sequence of transmission symbols, transmission symbol signals that are equal in number to the predetermined number;
serializer circuitry configured to serialize the predetermined number of the transmission symbol signals, to generate a serial signal; and
a driver that operates on a basis of the serial signal,
wherein the transmission symbol generator circuitry includes:
a plurality of symbol generators each of which generates, on a basis of the predetermined number of the transition signals and on a basis of a predetermined symbol signal that differs for the plurality of the symbol generators, symbol signals that are equal in number to the predetermined number; and
selector circuitry configured to select, from a plurality of sets of the predetermined number of the symbol signals, a single set of the predetermined number of the symbol signals as the predetermined number of the transmission symbol signals, the plurality of sets of the predetermined number of the symbol signals being generated by the plurality of the symbol generators.

20. The transmission device according to claim 19, wherein
the transmission symbol generator circuitry further includes a flip flop that performs a sampling of one transmission symbol signal out of the predetermined number of the transmission symbol signals, and
the selector circuitry selects, on a basis of a result of the sampling in the flip flop, the single set of the predetermined number of the symbol signals, from the plurality of sets of the predetermined number of the symbol signals.

* * * * *